United States Patent [19]
Cauwenberghs et al.

[11] Patent Number: 5,479,170
[45] Date of Patent: Dec. 26, 1995

[54] METHOD AND APPARATUS FOR LONG-TERM MULTI-VALUED STORAGE IN DYNAMIC ANALOG MEMORY

[75] Inventors: Gert Cauwenberghs, Pasadena; Amnon Yariv, San Marino, both of Calif.

[73] Assignee: California Institute of Technology, Pasadena, Calif.

[21] Appl. No.: 146,660

[22] Filed: Nov. 2, 1993

Related U.S. Application Data

[63] Continuation-in-part of Ser. No. 962,451, Oct. 16, 1992, Pat. No. 5,258,759.
[51] Int. Cl.$^6$ ...................................................... H03M 1/00
[52] U.S. Cl. .......................................... 341/200; 341/110
[58] Field of Search ................................... 341/110, 144, 341/200

[56] References Cited

U.S. PATENT DOCUMENTS

| | | | |
|---|---|---|---|
| 3,958,210 | 5/1976 | Levine | 357/24 |
| 4,000,418 | 12/1976 | Waldron et al. | 357/24 |
| 4,065,766 | 12/1977 | Butler et al. | 341/172 |
| 4,070,667 | 1/1978 | Eichelberger | 341/172 |
| 4,072,939 | 2/1978 | Heller et al. | 341/172 |
| 4,144,526 | 3/1979 | Wotruba | 341/172 |
| 4,280,196 | 7/1981 | Hornak et al. | 341/110 |
| 4,369,378 | 1/1983 | Rockett, Jr. | 341/200 |

OTHER PUBLICATIONS

"A Cyclic A/D Converter That Does Not Require Ratio-Matched Components" IEEE Journal of Solid-state Circuits, vol. 23, No. 1, Feb., 1988 by Hidetoshi Onodera, Tetsuo Tateishi and Keikichi Tamaru.

"Reference Refreshing Cyclic Analog-to-digital and Digital-to-analog Converters" IEEE Journal of Solid-state Circuits, vol. SC-21, No. 4, Aug., 1986. by Cheng-Chung Shih and Paul R. Gray.

"Implementation a Learning Kohonen Neuron Based on a New Multilevel Storage Technique" IEEE Journal of Solid-state Circuits, vol. 26, No. 3, Mar. 1991 by Bertrand Hochet, Vincent Peiris, Samer Abdo, and Michel J. Declercq.

*Primary Examiner*—Marc S. Hoff
*Attorney, Agent, or Firm*—Blakely, Sokoloff, Taylor & Zafman

[57] ABSTRACT

A method and apparatus is described for refreshing the analog content of a analog memory having a volatile storage device. An analog value stored on a volatile storage device is iteratively adjusted to maintain the analog value in proximity to one of a set of predetermined discrete analog memory levels. Binary quantization of the stored value, yielding one bit of information corresponding to the analog value stored, determines whether to increase or decrease the stored value by a given small amount. In essence, the bit obtained by binary quantization encodes the direction toward the nearest discrete level. Memory retention achieved by periodic iteration of the method is robust to noise and random errors in the quantization, over a wide range of operating conditions. The apparatus includes as functional elements a binary quantizer and an increment/decrement refresh device, which may interface with the analog storage means in a variety of configurations, including configurations supporting multiplexed schemes for sharing quantizers and increment/decrement refresh devices among multiple storage cells.

36 Claims, 12 Drawing Sheets

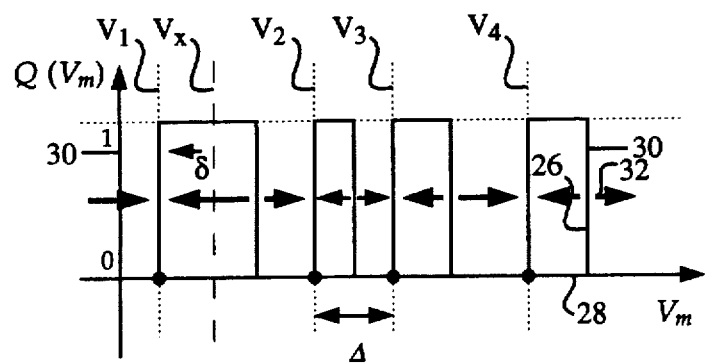
Figure 2
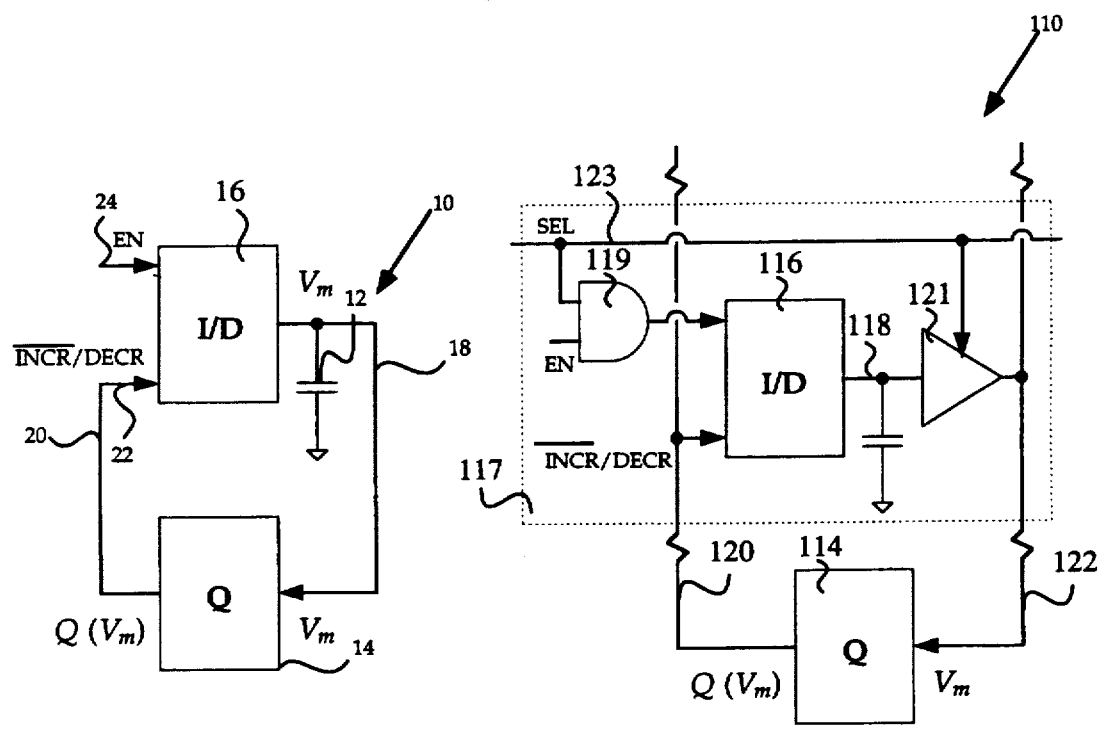
Figure 3a               Figure 3b

METHOD AND APPARATUS FOR LONG-TERM MULTI-VALUED STORAGE IN DYNAMIC ANALOG MEMORY

RELATED PATENT APPLICATION

The present application is a Continuation-in-Part of U.S. patent application, Ser. No. 07/962,451 filed Oct. 16, 1992, now U.S. Pat. No. 5,258,759, for a Method and Apparatus for Monotonic Algorithmic Digital-to-Analog and Analog-to-Digital Conversion.

BACKGROUND OF THE INVENTION

1. Field of the Invention

The present invention relates to analog memories and, more particularly, to a method and apparatus for refreshing the volatile memory content of an analog memory.

2. Art Background

One of the most challenging problems faced by massively parallel analog information processing implemented in very large scale integration (VLSI) is the local storage of analog information. In most such applications, the analog information is preferably stored in an analog format providing long-term random-access storage. Examples of VLSI applications where such integrated analog storage is desirable include the storage of programmable analog coefficients for audio and video signal processing, for neural information processing, and for process control. Unlike well developed methods for digital programmable storage by means of SRAM and DRAM technology, the random-access long-term storage of analog information in VLSI has enjoyed little success.

In a typical analog storage system, a voltage level on a capacitor encodes an analog memory value, in a manner generally analogous to the storage of binary information in digital memory. However, drift of the voltage of the capacitor due to leakage and noise typically affects the analog representation much more drastically than similar drift in a digital system affects a binary representation. The drift due to leakage is unavoidable if the storage capacitor is directly accessible for writing, and thereby in ohmic contact with surrounding circuitry. In contrast, a floating-gate storage capacitor, completely insulated by a surrounding oxide, avoids memory degradation due to leakage but precludes direct write-access for programming except by slow electron transport through the oxide.

Most applications requiring direct write-access to analog voltages stored in an array of capacitors in VLSI have conventionally used off-chip digital storage and external D/A conversion to periodically refresh the programmed voltages. For large-scale storage, the off-chip method requires high-bandwidth off-chip communication and extra external components, rendering the off-chip method unacceptably expensive.

Because of the disadvantages of off-chip methods, research has been directed to local storage mechanisms for large-scale integrated programmable analog memories. (See, for example, B. Hochet, "Multivalued MOS Memory for Variable-Synapse Neural Networks," *Electronic Letters*, vol. 25, pp. 669–670, 1989; B. Hochet, V. Peiris, S. Abdot, and M. J. Declercq, "Implementation of a Learning Kohonen Neuron Based on a New Multilevel Storage Technique," *IEEE J. Solid-State Circuits*, vol. 26, pp. 262–267, 1991; and E. Vittoz, H. Oguey, M. A. Maher, O. Nys, E. Dijkstra, and M. Chevroulet, "Analog Storage of Adjustable Synaptic Weights," in *VLSI Design of Neural Networks*, Norwell MA: Kluwer Academic, 1991, pp. 47–63.) The basic technique developed by this research is to quantize the analog values stored in the memory, thereby restricting the range of the analog values to a finite set of discrete levels. The analog values are periodically refreshed towards the nearest discrete level to prevent substantial drift of the values. In this manner, the analog values encode digital information, even though no digital storage is required. Instead, the inherently digital information is stored in analog format on a memory capacitor and is repeatedly retrieved by identifying the nearest discrete level. The quantization provides a certain excursion margin for the memory values between consecutive refresh operations, which retrieve the correct discrete level only as long as the refresh rate is fast enough to counteract the effect of the drift. To ensure that the stored value never deviates from one memory level to another, the expected drift accumulated over one refresh interval should be considerably smaller than the separation between neighboring quantization levels. Accordingly, the maximum number of quantization levels that can be resolved by the analog memory depends on the time scale of the refresh intervals relative to the time scale of nominal voltage drift.

In one implementation of the above-described basic technique, as proposed and demonstrated by Hochet (B. Hochet, "Multivalued MOS Memory for Variable-Synapse Neural Networks," *Electronic Letters*, vol. 25, pp. 669–670, 1989, and B. Hochet, V. Peiris, S. Abdot, and M. J. Declercq, "Implementation of a Learning Kohonen Neuron Based on a New Multilevel Storage Technique," *IEEE J. Solid-State Circuits*, vol. 26, pp. 262–267, 1991), a discrete level nearest to a storage value is identified by exhaustive sequential comparison of the storage value with a complete set of the discrete levels. Alternatively, an analog-to-digital-to-analog converter (A/D/A converter) is employed to determine the nearest discrete level without requiring an exhaustive comparison of all discrete levels. An extensive review of such techniques, and other techniques, for refresh in dynamic analog memories can be found in "Analog Memories for VLSI Neurocomputing" by Y. Horio and S. Nakamura in *Artificial Neural Networks: Paradigms, Applications and Hardware Implementations* from IEEE Press, edited by E. Sanchez-Sinencio and C. Lau, pp. 344–364, 1992. In either case, once the nearest discrete level is identified, the analog value representing the nearest discrete level is used to overwrite the stored analog value, thereby refreshing the analog memory. A primary disadvantage of this method is that a mis-identification of the nearest level, even if such occurs rather rarely, causes unrecoverable loss of information. The loss occurs because the value stored in the memory element is replaced by the value of the identified discrete level, erasing all previous information in the refresh process. Furthermore, the requirement that an analog signal be transmitted to the storage device on each refresh cycle requires significant resources, requiring a stable source continuously and consistently generating the discrete levels in sequence. This adds another source of error, likely causing a mis-identification of the nearest level if a significant offset exists between the actual value of the discrete level and a measured value. Such an offset can result from operation of a buffering (unity gain) amplifier in the refresh loop and also from switch injection noise occurring due to clock feed-through while refreshing the memory.

SUMMARY OF THE INVENTION

From the foregoing, it can be appreciated that there is a need to provide an improved method and apparatus for the refreshing of the volatile content of an analog memory. It is an object of the invention to provide such an improved method and apparatus. One particular object of the invention is to provide an analog storage method and apparatus which avoids the disadvantages of conventional analog storage systems described above wherein an analog value is overwritten by a new, and possibly erroneous, quantized analog value by application of an analog signal.

These objects, and other general objects of the invention, are achieved by a method for performing a partial refresh of an analog memory wherein an analog storage value is repeatedly increased or decreased by incremental amounts to maintain the analog value near a nearest one of a plurality of discrete quantized levels. The analog value is increased or decreased based on a determination of the analog value, e.g., based on whether the analog value is above or below a selected predetermined level. The direction of the adjustment is preferably based on a binary quantization of the analog value. The incremental amounts, which may be fixed, are substantially less than a minimum separation between adjacent levels.

In one embodiment the invention provides an apparatus wherein the analog value is repeatedly adjusted by an incremental amount toward a nearest discrete level based on a binary value generated from the analog value. The apparatus for performing the partial incremental refresh includes a binary quantization means for generating a binary value in response to the analog value, with the binary value being in either a first state or a second state. The state of the binary value is determined from the analog value in a consistent and repeatable manner. Means are also provided for increasing the analog value if the binary value is in the first state and for decreasing the analog value if the binary value is in the second state.

A set of discrete levels are preferably predetermined with the binary quantization means operating to determine whether the stored analog value is greater than or less than a nearest one of the predetermined levels. Alternatively, the discrete levels are implicitly defined by operation of the binary quantization means such that no explicit comparison between the analog value and a set of discrete levels is required. In the latter, the relationship of the output binary states of the binary quantization means to the input analog value effectively defines a set of analog discrete levels.

In either case, the analog value is increased or decreased by an amount which is less than a minimum difference between adjacent discrete levels to ensure that the analog value remains near a desired discrete level or within a desired range of values. In this manner, an analog value is refreshed without requiring a complete overwrite of an original analog value. Also, because the direction of each incremental refresh is based on a binary value, only a binary signal rather than an analog signal need by transmitted to the analog storage device at each refresh cycle, and less resources are required.

Preferably, the binary quantization means deterministically generates a binary value based on the analog value. However, the operation of the binary quantization means need not be deterministic, rather a probabilistic relationship suffices. The system operates correctly as long as the binary output values are correlated with the input analog values in some repeatable, consistent manner. In other words, the apparatus tolerates occasional errors that might occur in quantization. An error in determining the correct state of the binary value corresponding to the analog value will not result in a permanent replacement of the analog value with an incorrect analog value. Rather, an erroneous determination of the correct state of the binary value merely causes a single incremental adjustment away from a desired discrete level. Subsequent refresh cycles ultimately ensure that the analog value is drawn toward the correct discrete level. This avoids a loss of information as a result of an error in refresh and substantially guarantees long-term stability of the analog storage means. In general, any form of analog-to-binary conversion device which operates in a generally repeatable and consistent manner can be employed as the binary quantization means. Some specific, binary quantization means are described. In particular, a analog/digital/analog converter is described as assisting in one preferred embodiment of the binary quantization means, whereby the quantization bit is obtained as the least significant bit of an analog-to-digital conversion operation.

In its various embodiments, the invention provides an analog storage system substantially unhindered by problems affecting previous analog storage systems. An analog storage system constructed in accordance with the principles of the invention achieves performance and economy not heretofore achieved with conventional analog storage systems.

BRIEF DESCRIPTION OF THE DRAWINGS

The objects, features and advantages of the present invention will be apparent from the following detailed description in which:

FIG. 2 illustrates a binary quantization function employed in determining the binary quantization value of the method of FIG. 1;

FIG. 3a illustrates a portion of an analog memory, having a single analog storage cell, a binary quantizer (Q) and an increment/decrement device (I/D) constructed in accordance with a preferred embodiment of the invention;

FIG. 3b illustrates a portion of an alternative embodiment of an analog memory, having an analog storage cell, a binary quantizer (Q), an increment/decrement device (I/D) and time multiplexing means, wherein the single binary quantizer is shared by other storage cells and increment/decrement devices (not shown);

FIGS. 6–12b relate to an exemplary embodiment of the binary quantizer (Q) of FIG. 5 employing an analog/digital/analog converter, wherein:

FIG. 6 shows a tree structure tracing sequences of intermediate states for a digital-to-analog conversion implemented by the exemplary embodiment of the binary quantizer (Q) of FIG. 5;

FIG. 7 shows a sequence of intermediate steps in processing a particular example following the digital-to-analog conversion method implemented by the binary quantizer of FIG. 6;

FIG. 8 illustrates schematically the concept of a bi-directional replication element which is utilized by the binary quantizer of FIG. 6;

FIGS. 9a–9b illustrate a CMOS implementation as one embodiment of the bi-directional replication element of FIG. 8;

FIGS. 10a–10b show the block diagram and a specific CMOS implementation of a digital-to-analog converter implemented by the binary quantizer of FIG. 5 utilizing hi-directional replication elements.

FIGS. 11a–11b show a block diagram and a specific CMOS implementation of an analog-to-digital converter which utilizes the digital-to-analog converter implemented by the binary quantizer of FIG. 5.

FIGS. 12a–12b show a block diagram and a specific CMOS implementation of a combined digital-to-analog and analog-to-digital converter with matched conversion characteristics implementing the binary quantizer of FIG. 5.

DETAILED DESCRIPTION OF THE INVENTION

Analog Storage Device

A method and apparatus for refreshing an analog storage device are described below. The invention, as described herein, may be implemented using conventional CMOS and VLSI technologies. However it should be borne in mind that the invention may transcend various implementation technologies in different environments. To cover apparatus embodiments of the invention in as complete a range as possible, some components well-known in the art are represented by functional blocks which encompass numerous alternative devices. Such components have not been specified in detailed structural form, leaving the choice of specific implementations to the designer.

Referring to the figures, various preferred embodiments of the refresh method and apparatus of the invention will now be described. First general principles of the invention are described with reference to FIG. 1–2. Various apparatus embodiments of the analog memory are described with reference to FIGS. 3a–5. In one embodiment, the analog memory includes an analog-to-digital-to-analog converter. The analog-to-digital-to-analog converter is described primarily with reference to FIGS. 6–12b. Finally, some experimental results are described with reference to FIGS. 13a–13b.

Figure 1:
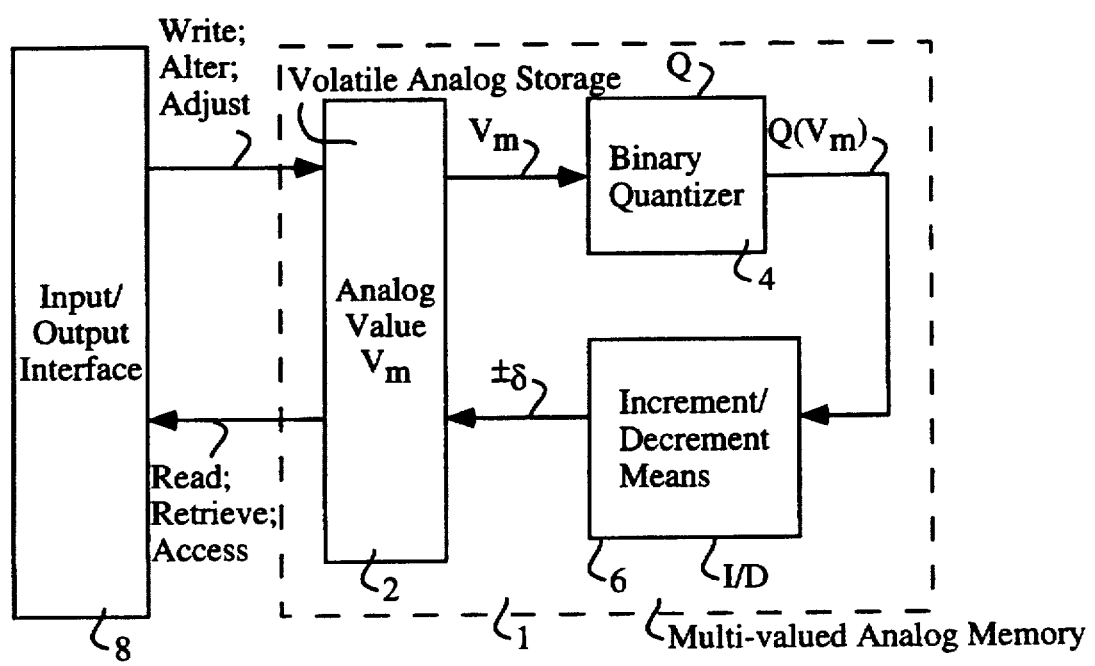
FIG. 1 is a block diagram illustrating a multi-valued analog memory having a refresh capability for refreshing an analog value by incrementally adjusting the analog value up or down to maintain the analog value near one of a plurality of predetermined discrete levels.

Referring first to FIGS. 1–2, the method and apparatus for refreshing a quantized analog storage device will be generally described. As noted above, analog values stored in analog storage devices are often subject to drift, i.e., the analog value drifts away from a desired discrete level. To compensate for the drift, the analog storage device must be periodically refreshed. This is typically achieved by overwriting the drifted analog value with an analog value set to a desired level. Also, as noted above, conventional methods for performing the refresh can result in an incorrect overwrite operation. The method and apparatus of the invention avoids this, and other problems, by repetitively adjusting the analog value with small fixed-size increments to maintain the analog value near one of a set of discrete levels. The polarity of the incremental refresh, either raising or lowering the analog value by a fixed amount, is determined by a binary value obtained from the analog value. The state of the binary value is generated in response to the analog value in a consistent manner to ensure that the analog value is correctly incremented either up or down to maintain the analog value near the desired discrete level. In effect, the binary value represents the polarity of the incremental adjustment towards the nearest discrete level of the analog memory.

Hence, in general, the invention avoids problems of the prior art by employing binary quantization to generate a binary quantization value from the analog value and "partial refresh" to incrementally adjust the analog value based on the binary value.

FIG. 1 illustrates an apparatus for performing the partial incremental refresh of the invention. More specifically, Figure i illustrates an analog memory 1 having a volatile analog storage means 2, a binary quantizer means (Q) 4, and an increment/decrement means (I/D) 6. Analog storage means 2 also interfaces with the outside for access of the stored value in both read and write directions, represented symbolically by an Input/Output Interface 8 in FIG. 1. Analog storage means 2 stores a discrete analog value $V_m$ which may be subject to drift. Binary quantization means 4 and increment/decrement means 6 together operate to periodically refresh storage means 4 to maintain the analog value near a desired discrete level, thereby preventing drift from substantially varying the analog value. Generally speaking, this is achieved by transmitting the analog value to quantizer 4 which generates a binary value, represented by $Q(V_m)$, in response to the value of $V_m$. The binary value $Q(V_m)$ is then transmitted to refresh means 6 which increments or decrements the value of $V_m$ stored with storage means 2 depending upon the state of $Q(V_m)$. Thus, if $Q(V_m)$ is in a first state, which may be represented as a zero, refresh means 6 increases the analog value stored in storage means 4 by an incremental amount $\delta$. If $Q(V_m)$ is in a second state, which may be represented by a one, refresh means 6 decreases the analog value by amount $\delta$.

The implementation of the interface between the analog memory and the environment accessing the stored analog value depends upon the particular application. The symbolic representation of FIG. 1, Input/Output Interface 8 is shown connected to storage means 2 for the purpose of reading and writing information to and from the storage device. Other applications would require the analog storage value to be accessed in different ways. As indicated also in FIG. 1, the general situation allows the environment to occasionally adjust the value stored in memory and to non-destructively retrieve the stored analog value continuously in time for any useful type of processing. Depending upon the implementation, the input/output interface may also require connection directly to binary quantizer 4, as specified further below in one embodiment of the quantizer featuring digital write access to the stored analog value.

The manner by which the desired discrete analog levels are initially defined and the manner by which quantizer 4 generates binary values having an appropriate polarity may vary considerably, consistent with general principles of the invention. For example, quantizer 4 may be preprogrammed with a set of predetermined analog storage levels with the analog value within storage means 2 being initially set to near one of the predetermined levels, with the nearest initial predetermined level representing a desired level. Subsequently, if binary quantizer 4 determines that the analog value is greater than a nearest predetermined discrete level, then binary quantizer 4 generates a binary value indicating that the analog value is to be decremented. In this manner, an analog value which drifts above a desired discrete level is adjusted downwardly toward the discrete level. Conversely, if binary quantizer 14 determines that the analog value is less than the nearest predetermined level, then binary quantizer 4 generates a binary value in an opposite state indicating that the analog value is to be increased. By repeated iteration, the analog value is maintained near the desired discrete level. Thus, in such an implementation, a set of discrete levels are predetermined and the quantizer determines whether the analog value is above or below a nearest predetermined level.

Alternatively, however, predetermined discrete levels need not be explicitly defined in the quantization. Rather, binary quantizer 4 can be configured to implicitly define a set of discrete analog storage levels for storing values within analog storage means 2. In such an implementation, binary quantizer 4 generates binary values in response to the input analog value in a consistent and substantially repeatable manner. In other words, in certain regions of the analog input range, the quantizer usually produces a binary output in the first state, causing the analog value to be slightly incremented. Conversely, in the other, complementary regions of the input range, the quantizer usually outputs a binary value in the second state, slightly decreasing the analog value corresponding. In this manner, the analog value becomes trapped in the immediate range at one of the boundaries between consecutive regions of first and second binary output states, respectively, where a strong attraction from both sides of the boundary occurs. The boundaries between consecutive first and second output state regions, in that order, correspond to the stable states of the refresh process and thereby identify the discrete levels of analog storage in the memory.

Obviously, the latter formulation of the refresh procedure, without any references to predetermined discrete levels, allows for ample freedom in the implementation of the quantizer. However, the latter formulation is functionally equivalent to the first one, for which the quantization explicitly involves use of pre-defined discrete levels. Indeed, in the first formulation, the only information required from analog value to define a refresh action is binary, since only the polarity of the refresh action needs to be determined, and a specification of the nearest level itself is not explicitly required. The polarity to be determined depends uniquely on the position of the analog memory value relative to that of the nearest discrete value, and can be rendered in the form of a binary quantization function defined on the analog input variable, alternating between zeros and ones according to the distance of the analog value from nearby discrete levels:

$$Q(.) \; \mathfrak{R} \to \{0,1\} \qquad (1)$$

The first formulation, with explicit reference to the discrete levels in the quantization, is therefore formally equivalent to the second formulation, employing a consistent and substantially repeatable but otherwise arbitrary quantization characteristic. The latter formulation is obviously more general, and will be primarily adopted in the following.

An example illustrating the shape of the binary quantization function Q(.) is shown in FIG. 2. Binary quantization function Q(.) is identified by reference numeral 26 and is shown as being a function of an analog value which may be any analog parameter such as an analog voltage. $V_m$ is illustrated along axis 28. The binary value of quantization function Q(.) is illustrated along axis 30. As can be seen, binary quantization function Q(.) has only one of two possible values for each value of $V_m$, i.e. (.) is either a one or a zero. FIG. 2 also illustrates discrete levels $V_1$, $V_2$, $V_3$ and $V_4$ Differences between adjacent discrete levels do not need to be uniform and, as illustrated, differences between $V_1$, $V_2$, $V_3$ and $V_4$ are not uniform. As can be seen, a difference between $V_3$ and $V_2$ is somewhat less than a difference between $V_4$ and $V_3$. In FIG. 2, the difference between $V_3$ and $V_2$ is identified by $\Delta$. In the example of FIG. 2, $\Delta$ represents the smallest difference between adjacent discrete levels. FIG. 2 also illustrates an exemplary analog value $V_x$, between $V_1$ and $V_2$. Quantization function Q has a binary value one for the corresponding analog value of $V_x$.

Arrows 32 indicate the direction of the refresh to be performed by I/D device 6 for corresponding analog values. For a quantization bit value equal to one, the analog value is decreased by an amount δ; otherwise the analog value is increased by δ. Formally, with $V_m$ representing the analog value stored in memory, and with δ representing the amplitude of the refresh step:

$$V_m' = V_m + \delta \text{ if } Q(V_m) = 0;$$

$$V_m' = V_m - \delta \text{ if } Q(V_m) = 1. \qquad (2)$$

For the example of $V_x$ illustrated in FIG. 2, binary quantization function $Q(V_x)$ has a value of 1, thereby indicating that the value is to be decremented by an amount δ towards discrete level $V_1$.

In general, with periodic iteration, the stored analog value $V_m$ undergoes strong attraction locally towards a nearby boundary region where the quantization makes a positive transition, from a zero to a one. The transition boundaries define the positions of the discrete memory levels as indicated in FIG. 2. The process of binary quantization and incremental refresh hence defines alternating regions of attraction and repulsion, creating and isolating the discrete levels for stable memory operation. The relationship between particular analog values and resulting binary states may be merely probabilistic, rather than deterministic, provided some degree of consistency is retained. For a small refresh amplitude δ, the strength of attraction and repulsion in the alternating regions remains virtually unattenuated under noise contaminating the binary quantization and causing occasional errors in the evaluation of Q(.). Indeed, a large number of successive erroneous quantization bit values, steering the analog value in the wrong direction, are required to cause a transition from one stable state to another, such transitions becoming exponentially less likely to occur as the refresh amplitude δ is decreased. Therefore, the generation of a minority of erroneous binary values in response to an analog value unlikely causes the stored analog value to drift away substantially from the desired analog level towards another allowed analog level. This error avoidance capability is an important aspect of the invention as it eliminates high-accuracy and low noise requirements of conventional refresh devices. In essence, the error avoidance is achieved by exploiting redundancy and statistical averaging to avoid any sudden effect caused by a random error in the evaluation or application of the binary quantization value.

A small value for is also desirable to reduce dynamic refresh noise caused by repeated finite update increments at equilibrium, which ultimately limit the analog resolution of the stored value. To avoid a runaway instability condition for the stored value, the value for δ should not be decreased beyond a nominal amplitude of drift due to leakage over one refresh time interval. Thus, an appropriate value for δ should satisfy the conditions:

$$r_1 T < \delta << \Delta \qquad (3)$$

with $r_l$ representing a nominal leakage drift rate, T a refresh time interval, and Δ the smallest separation between adjacent discrete memory levels. Since leakage is temperature dependent and may not be uniform across different memory cells, a safety margin for the lower bound in equation (3) is advisable, such as $δ=10r_l T$, with a corresponding adjustment to the time scale of refresh T provided to accommodate the second condition $δ<<Δ$.

What has been described thus far, is a general method and apparatus for partially refreshing an analog value using a binary quantization function. With reference to FIGS. 3a–5, particular apparatus embodiments of the invention will be described.

FIG. 3a illustrates an analog memory 10 having an capacitor 12, a binary quantizer (Q) 14, and an increment/decrement (I/D) device 16. Capacitor 12 symbolically represents any suitable analog storage means. Capacitor 12 is connected to an input of binary quantizer 14 by line 18. A second line 20 connects an output of binary quantizer 14 to a first input 22 of I/D device 16. A second input 24 of I/D device 16 receives an enable signal EN. Although not shown, capacitor 12 may also interface with the outside by means of any input/output configuration supporting external access to the stored analog information on capacitor 12. Input and output provisions at the interface may include support for occasionally altering the stored analog value when needed, and support for non-destructively accessing and retrieving the stored value continuously in time, such as e.g. required for the analog storage of programmable coefficients in analog integrated filters. The input/output interface may also require connection to quantizer 14, in conjunction with the analog storage 12.

All the elements illustrated in FIG. 3a are preferably configured as solid state components on an integrated circuit device. In this regard, capacitor 12 may be implemented using conventional techniques as a capacitive element on the integrated chip. Quantizer 14, I/D device 16 and capacitor 12 perform the functions described above with reference to the elements of FIG. 1. More specifically, an analog value stored within capacitor 12 is detected by quantizer 14 which generates a binary value in response thereto. The binary value is input to I/D device 16 which increments or decrements the analog value stored within capacitor 12, in accordance with the polarity of the binary value. With proper choice of quantizer Q and with a suitably small amount of increment or decrement, the analog value stored on capacitor 12 is maintained near a desired predetermined level. The enable signal received by I/D device 16 through input port 24 controls operation of the I/D device, repeatedly activating the selected increment or decrement onto the analog value in the storage means once the quantization bit, selecting the polarity, is detected.

FIG. 3b illustrates an alternative embodiment wherein a single quantizer 114 is shared among several memory cells 117, by time-multiplexing access to quantizer 114 for a plurality of cells. To achieve time multiplexing of access to quantizer 114, multiplexing selection circuitry at the interface of cell 117 is provided, which includes a binary input enable selector (symbolically depicted by an AND-gate 119 in FIG. 3b) and a buffering analog output multiplexer (symbolically represented by a gated buffer 121 in FIG. 3b). Time-multiplexing of the quantizer as illustrated in FIG. 3b may result in significant hardware savings, and is practical where a single quantizer has sufficient bandwidth to support time requirements imposed by all participating memory cells combined. Operation proceeds in a similar manner to that for FIG. 3a, except that a select signal SEL which identifies a particular memory cell to be refreshed at a particular moment is provided on an input line 123. Ideally, the select signal periodically cycles through all memory cells in a systematic fashion to provide a uniform refresh cycle time among all participating cells, thereby achieving uniform performance.

Thus, FIG. 3b illustrates an embodiment wherein a single quantizer is shared among several memory cells with each memory cell having an I/D device. Other configurations are also within the scope of the invention. For example, a configuration may be provided which shares not only binary quantization devices but also I/D devices. As can be appreciated by those skilled in the art, various multiplexing or selection and buffering devices may be required to implement particular embodiments. These additional devices may be implemented in accordance with conventional techniques which will not be described in detail herein.

The basic components of single cell analog memory 10 of FIG. 3a and a multiple cell analog memory 110 of FIG. 3b may be implemented using a variety of specific components, examples of which are described in detail below.

Figure 4:
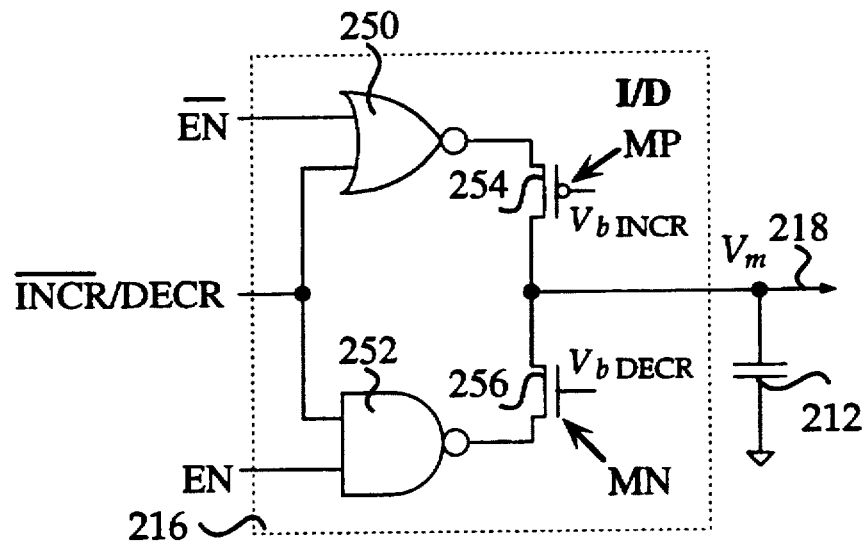
FIG. 4 illustrates an exemplary embodiment of the increment/decrement (I/D) device of FIGS. 3a–3b.

FIG. 4 illustrates one possible CMOS implementation of a bipolar increment/decrement device I/D 216, driving a capacitive storage device 212 at its output. I/D device 216 is appropriate for use as the increment/decrement device of the analog memory of FIGS. 3a and 3b. I/D device 216 includes a NOR gate 250 and a NAND gate 252. NOR gate 250 receives an inverted enable signal $\overline{EN}$ and an increment/decrement ($\overline{INCR/DECR}$) signal. NAND gate 250 receives a non-inverted enable signal EN as well as the increment/decrement signal. The $\overline{EN}$ signal represents the complement of the EN signal. An additional inverter, not shown, may be used to invert the enable signal illustrated in FIGS. 3a and 3b to yield the inverted enable signal input shown in FIG. 4. I/D device 216 also includes a pair of transistors MP and HN, identified by reference numerals 254 and 256 respectively. The output of NOR gate 250 is connected to a source of MP transistor 254. The output of NAND gate 252 is connected to a source of MN transistor 256. Drains of the respective transistors are connected along output line 218 to capacitor 212. Gates of the transistors 254 and 256 are connected to bias voltages $V_{b\ DECR}$ and $V_{b\ INCR}$, respectively.

Transistors 254 and 256, when activated, operate as current sources, supplying fixed currents of either polarity onto the storage capacitor 212. MN transistor 256 represents a sinking current source. MP transistor 254 represents an injecting current source. Amplitudes of the currents are set by the level of bias voltages $V_{b\ DECR}$ and $V_{b\ INCR}$ on the gates of the transistors. For increment action, injecting current source MP transistor 254 is activated by driving EN active high and $\overline{INCR/DECR}$ active low. For the decrement action, sinking current source MN transistor 256 is activated by driving both EN and $\overline{INCR/DECR}$ active high. The selection and activation of the currents from the logic control levels is accomplished by means of the NAND and NOR gates, which drive the sources of MOS transistors 254 and 256 to select and activate either current. Note that the switching of the current supplied by transistors 254 and 256 is controlled by driving the source voltage on the transistors, rather than by driving the gate voltage, thereby avoiding switch injection noise caused by clock feed-through. Switch injection noise is a typical phenomenon for gate-controlled switch capacitor circuitry which can result in an unpredictable offset on the voltage across a capacitor occurring when a switch coupled to the capacitor is opened. However, because the gates of MP transistor 254 and MN transistor 256 are kept at constant bias voltages, substantially no such parasitic injection of charge can reach storage capacitor 212 when either of the currents are deactivated. By virtue of the clean switching transients, the I/D device of FIG. 4 is therefore able to resolve unusually small increment and decrement amplitudes by biasing the MN and MP transistors in a sub-threshold (pA) current range. In the sub-threshold range, exponential control of the currents by the gate voltage levels, in combination with the pulse width control of the EN enable signal, achieves a wide dynamic range for adjustment of the increment and decrement amplitudes. Furthermore, the sub-threshold current across a MOS transistor and the leakage current across a reverse biased p-n junction both follow an $\alpha\exp(-1/kT)$ temperature dependence, such that the sub-threshold refresh amplitude and the spontaneous leakage of the storage capacitor exhibit matched thermal characteristics. Therefore, in an analog VLSI implementation, the requirement for stability imposed by the left-hand side of equation (3) is met over a wide temperature range by the embodiment of FIG. 4.

Figure 5:
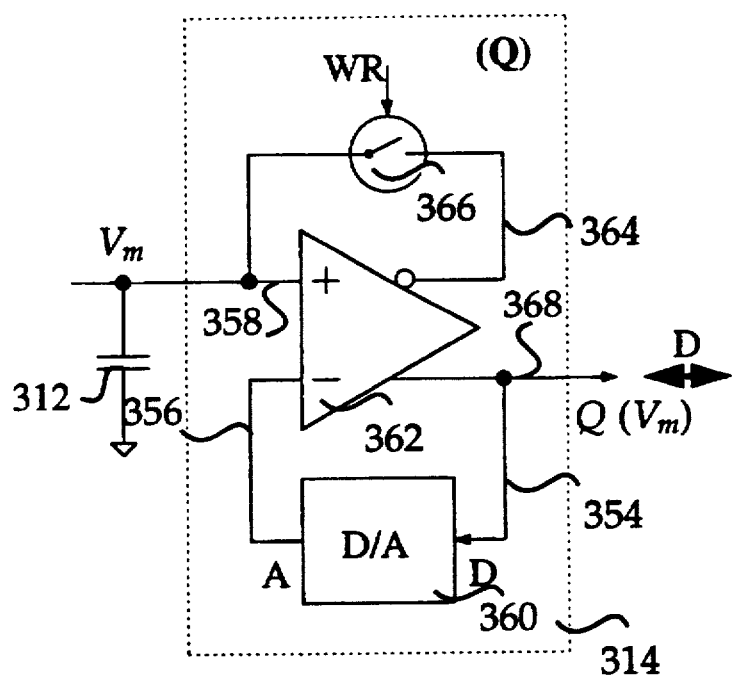
FIG. 5 illustrates an exemplary embodiment of the binary quantizer (Q) of FIGS. 3a–3b.
Figure 6:
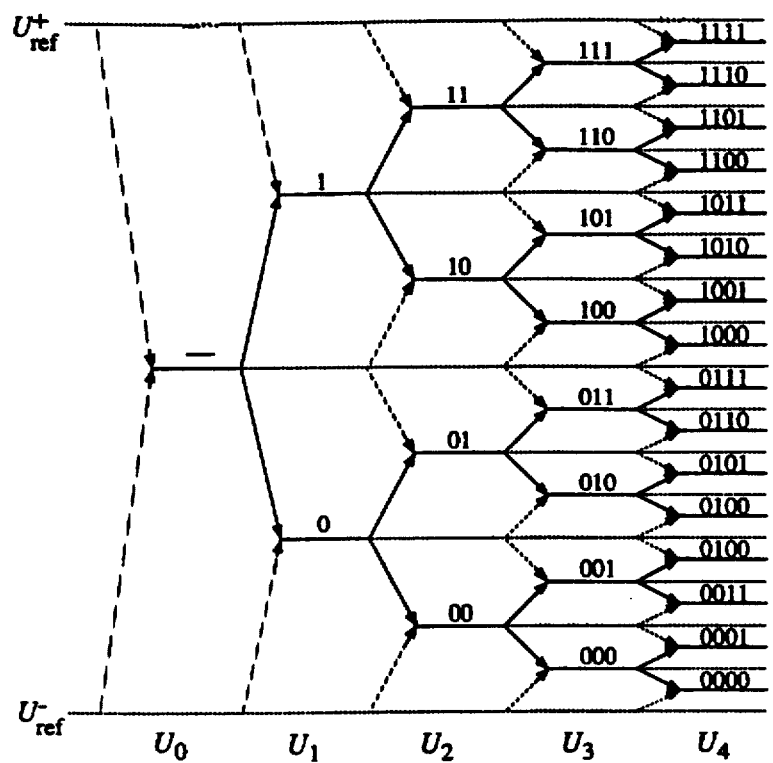

As noted above, any apparatus which accepts an analog input and yields a binary value at the output corresponding to that input in a consistent manner may be suitable for use as binary quantizer Q, provided the input-output characteristic of the device contains sufficient and fairly distributed bit alterations for accommodating a desired resolution of the analog memory. A particular implementation of a binary quantizer will now be described with reference to FIG. 5. In FIG. 5, a binary quantizer 314 is shown connected to a capacitive storage element 312, or other analog storage element. The direct connection of the storage element 312 to the quantizer input 358 as shown is not essential and other configurations for access to the stored information are possible, especially for the purpose of multiplexing the quantizer inputs 358 amount several storage means 312, according to the principles with regard to FIG. 3b outlined before. In the context of the configuration in FIG. 3b, more than one storage means 118 are allowed to access the quantizer input 122, through sequential activation of multiplexing buffering circuitry 121. A particular storage means 118 is then temporarily configured as connecting to the quantizer input, conform to the input configuration depicted in FIG. 5, when its corresponding SEL signal 123 is active.

The particular embodiment of the quantizer illustrated in FIG. 5 supports a uniform distribution of discrete levels at any desired (radix-2) resolution, and additionally provides bi-directional (read/write) digital access to stored analog memory values. More particularly, quantizer 314 of FIG. 5 is a bit-serial bi-directional A/D and D/A converter (A/D/A converter). In the following, quantizer 314 will alternatively be referred to as A/D/A converter 314. The core of A/D/A converter 314 comprises an algorithmic bit-serial D/A converter 360, for processing the bit sequence of a digital word in the order from the most significant bit (MSB) to the least significant bit (LSB) algorithmically, thereby generating an analog output value from successive intermediate values corresponding to a partial bit-accumulated conversion result. An analog output A of the D/A converter 360 is connected to the negative input 356 of the latched comparator 362. One output 354 of the comparator is connected to a digital input of D/A converter 360. This output is also connected to external components for providing a quantization signal $Q(V_m)$. The provision of latched comparator 362 allows A/D/A converter 314 to operate as a successive approximation A/D converter by employing the intermediate values of D/A conversion as successive approximations for comparison with an analog input, to determine the bit sequence of the digital output in the order of MSB to LSB. A second inverting output 364 of comparator 362 is provided for direct write access to the analog storage by means of a feedback loop connecting the inverting output 364 to the positive input 358 of the comparator, in contact with the analog storage device 312 to which it is configured. This feedback loop, when activated, allows writing an analog value, obtained from a digital input sequence presented at the D/A converter input 354, onto the storage device 312 configured at the quantizer input 358. In particular, when the inverting output 364 is enabled, the comparator is configured as a differential high-gain amplifier, and in combination with the feedback loop acts as a unity-gain buffered amplifier copying the D/A conversion result 356 onto the storage means 312. To that purpose, line 364 may include a WR switch 366, coupled to the positive compactor input 358, as indicated in FIG. 5. Other ways of implementing the feedback loop between the inverted output 364 and the storage device 312 at the input 358 may be adopted, depending on the input configuration. Particularly, in the aforementioned case of a multiplexed configuration sharing the quantifier input shared among several storage devices shown in FIG. 3b, the feedback path cannot be established directly by means of the switch 366 since the storage device 118 selected at the input is isolated by means of the multiplexing buffer amplifier 121. One possible realization of the feedback loop is obtained by coupling the comparator output line 364 to all storage cells 117 in FIG. 3b (not shown), and by providing the switch 366 locally for every cell 117. Switch 366 would then be connected between the line 364 and the storage means 118, and would need to be inhibited in case the SEL signal 123 is inactive. Another alternative is to retain the switch 366 in the quantizer 314 as indicated in FIG. 5, and expanding the functionality of the buffering analog output multiplexer 121 in FIG. 3b into a bidirectionally buffering multiplexer, which can be configured to copy the analog value of 118 onto the storage device 118 when SEL 123 is active. Other realizations of the feedback path may be devised by those trained in the skills of the art, all of which do not alter the general scope of the invention.

The A/D/A apparatus as described is primarily intended as a binary quantizer, consistently producing an output bit $Q(V_m)$ at the quantizer output 368 in response to an analog value $V_m$ at the quantizer input 358, through a procedure outlined below. With the provisions for external write and read access to the storage devices in digital format, the quantizer allows extra functionality in excess of the intended binary quantization, rendering the memory refresh apparatus more versatile. The combination of D/A and A/D conversion within a single device provides a means of bidirectional access between the analog and digital domains, with matched transfer characteristics in both directions of conversion achieved by virtue of sharing the same hardware. The preferred embodiment of the A/D/A converter as further specified below additionally provides guaranteed monotonicity in the conversion characteristics regardless of component mismatches and non-linearities.

A/D/A converter 314 performs binary quantization of an analog input in an algorithmic manner. For an analog memory supporting n-bit resolution, i.e., $2^n$ discrete levels, the quantization bit Q is obtained from the least significant bit for (n+1)-bit A/D conversion, identified as the last bit in the bit-serial sequence of the digital output. The LSB of the (n+1)-bit conversion follows the desired regular profile of alternating ones and zeros of which the positive transitions, marking the positions of the equilibrium discrete memory levels under periodic refresh, coincide with the $2^n$ analog levels corresponding to the n-bit partial D/A conversion. Therefore, the multi-valued state of the memory is uniquely identified in digital format by the partial n-bit sequence preceding the LSB. While this method of dynamic refresh only retains the LSB as necessary information for the binary quantization, the remaining bits preceding the LSB provide a key to the digital access to the stored memory values, exploiting different operation modes provided by the A/D/A converter. Specifically, the following modes of operation are supported with the A/D/A embodiment of the binary quantizer, for a $2^n$-level analog memory:

a. partial refresh, by obtaining the quantization bit Q from the LSB of (n+1)-bit A/D conversion and subsequently activating the I/D device with the polarity of Q.

b. read access in digital format, by obtaining the digital word identifying the memory state by means of n-bit A/D conversion. Alternatively, to support uninterrupted dynamic refresh in the background, the digital word can be derived from the partial n-bit result obtained during the (n+1)-bit conversion needed for the binary quantization in operation mode a, above.

c. write access in digital format, by D/A conversion of the n-bit digital data to be written into the analog memory, and by subsequently activating the comparator to yield a binary value for Q, which reflects the result of comparing the analog memory value with the constructed analog conversion value. The assignment procedure for the binary value of Q is followed by activation of the I/D device with the polarity of Q, in order to effect a partial update of the analog memory value in the direction of the D/A conversion result.

Periodic iteration of the update produced from the write procedure of mode c, above, establishes the desired value, i.e. the discrete level corresponding to the digital word. This value is stored onto the storage memory element, in a fault-resistant and noise-tolerant manner similar to the mechanism of dynamic partial refresh. To speed up the writing process, the analog value on the storage device can be preset to a coarse approximation to the desired value, prior to the fine-tuning under the iterative process of the updates c. Such is achieved by temporarily closing WR 366 switch, or the equivalent feedback path in a multiplexed configuration, after initial D/A conversion, which forces the analog value of the D/A result onto the storage element by means of high-gain negative feedback.

Analog-to-Digital-to-Analog Converter

The foregoing provides a brief overview of the operation of an A/D/A converter for use in combination with the other components of the analog memory of the invention. A preferred embodiment of the algorithmic A/D/A converter will now be described in greater detail with reference to FIGS. 6–12b. The embodiment of the algorithmic converter may be employed as the quantizer element illustrated in FIG. 5.

Traditional algorithmic D/A converters process a digital word in a sequence starting with the LSB and ending with the MSB. The A/D/A converter for use with the present invention performs D/A conversions wherein the MSB is processed first and the LSB last. For such a method to proceed in an algorithmic fashion, every intermediate state $U_i$ in the conversion process for i ranging from 0 through n corresponds to the partial D/A conversion of the first i bits in the digital word, representing a spectrum of $2^i$ equally spaced discrete analog values. The spectra of discrete values for the intermediate states $U_i$ necessarily follow a tree structure from the initial to the final conversion state, schematically depicted in FIG. 6 for a bit length of n=4.

Each of the values for any given intermediate state $U_i$ branches into two possible values for the subsequent state $U_{i+1}$, the lower one corresponding to a "0" value of the bit being converted, and the higher one to a "1". The arrows in the graph indicate an algorithmic means of constructing the value of the state $U_{i+1}$ from the values of two previous states, generated in previous iterations of the conversion process. The solid arrows denote the contribution to the value of state $U_i$ by the value of the previous state $U_{i-1}$, and the broken arrows denote the contribution to the value of $U_i$ by the value of one of the earlier states, selected by the polarity of bit i. As the graph suggests, the value of $U_i$ is constructed simply by averaging the values of the two selected generating states. In accordance with the structure illustrated by FIG. 6, a practical conversion algorithm can be formulated, involving three analog "registers" U, $U^+$ and $U^-$ that are updated at every bit cycle i. To do so, it is necessary to introduce initialization values $U_{ref}^+$ and $U_{ref}^-$ defining the conversion range of the analog domain; $U_{ref}^+$ and $U_{ref}^-$ roughly correspond to the upper and lower limit of the analog spectrum respectively. The resulting D/A conversion algorithm can be defined in symbolic form as follows:

a) Initialization (i=0):

Preset $U_0^+$ to $U_{ref}^+$ and $U_0^-$ to $U_{ref}^-$; Set $U_0$ halfway in between $U_0^+$ and $U_0^-$;

b) Algorithmic Iteration (i–1 to i, from i=1 to n):

---

If bit i is "1": set $U_i^+$ to $U_{i-1}^+$ and $U_i^-$ to $U_{i-1}$;

"0": set $U_i^+$ to $U_{i-1}$ and $U_i^-$ to $U_{i-1}^-$;

---

Figure 7:
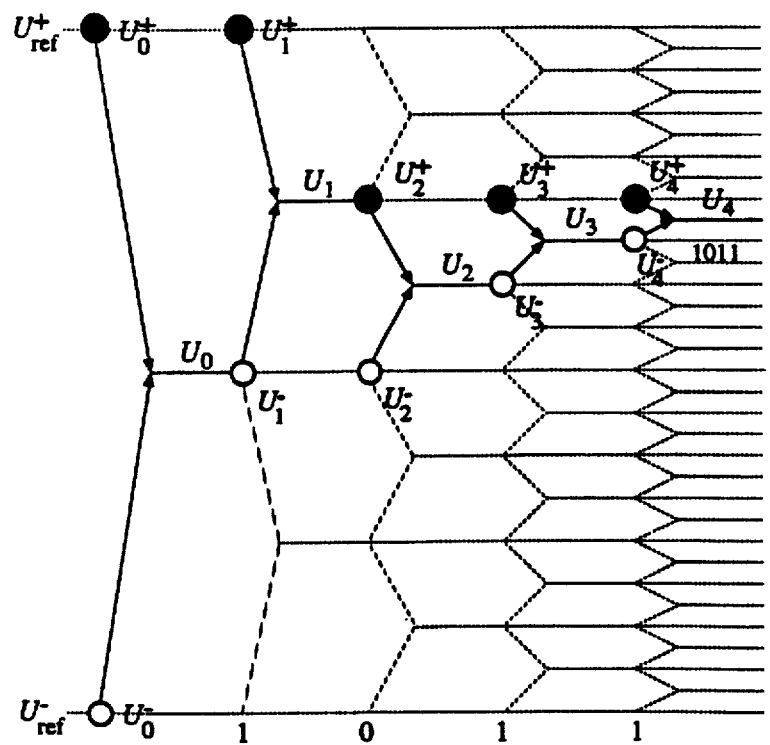

Set $U_i$ halfway in between $U_i^+$ and $U_i^-$;

c) Termination (i=n):

The final D/A conversion result is given by $U_n$,

As shown in the example illustrated by FIG. 7 in which the digital value 1011 is converted to its corresponding analog value, the intermediate analog states evolve from an initial value halfway between $U_{ref}^-$ and $U_{ref}^+$ to the final $U_4$ value. This conversion is monotonic in nature because it implements the branching tree structure of FIG. 6, preserving the proper sequence in the analog spectra for all of the intermediate states $U_i$ by due selection of the values for the pivots $U_i^-$ and $U_i^+$. This guaranteed monotonicity is true even if the intermediate states $U_i$ are not set exactly halfway in between the pivots $U_i^-$ and $U_i^+$, provided the deviation from the medium value is consistent.

An attractive feature of the foregoing technique is the successive approximation A/D conversion scheme. The combination of concurrent A/D and D/A conversion operations in a single architecture provides the final successive approximation as an analog output along with the digital conversion output. The value of this analog output, one value for each digital output of the converter, corresponds to the typical, ideal analog quantity at the converter input yielding that digital output. Hence, the analog output of the combined converter maps the analog input value to its closest discrete value, with the spectrum of discrete outputs determined by the resolution and operational range of the converter. The availability of the analog discrete level, along with the quantization obtained from the A/D conversion, is particularly convenient for the implementation of the invention, providing both write and read access in digital format, in accordance with the description of the procedures supported by the architecture of FIG. 5.

Figure 8:
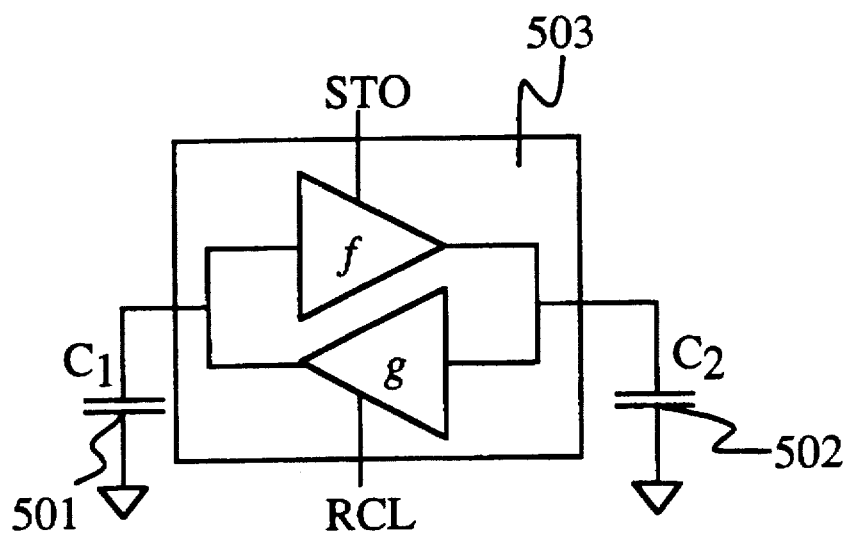

The A/D/A converter may be implemented in a variety of VLSI technologies, such as CHOS or CCD, each of which will vary the specific component structure. The specific technology chosen to implement the A/D/A converter is irrelevant to the operation. Functional elements of the converter are defined in the following general form:

a) A "charge holding means". The "size" or area of the device relates the total stored electrical charge to the planar charge density. In a context, the term "charge holding means" refers to one of the terminals of a capacitor, with the other terminal shorted at a fixed potential. The voltage across the capacitor is directly related to the amount of charge held by its capacitance. For simplicity, the term "charge holding means" will be substituted for the term "capacitor" in the further description below, nevertheless bearing in mind the generality of the device hereby referred to.

b) An element, called a "switch", for uniting the charge held by two capacitors whenever the switch is active, effectively redistributing the charge over both capacitors with equal charge density. The partition of the total charge among the two capacitors is determined by the ratio of the sizes of the two capacitors.

c) An element, called a "Bi-directional Replication Element" (BRE). FIG. 8 illustrates a BRE 503 coupled to two capacitors 501 and 502. The BRE 503 has two active states of operation: "store" (STO) and "recall" (RCL). In the STO mode, the charge $Q_1$ on capacitor 501 is sensed non-destructively and stored in the form of a charge $Q_2$ on capacitor 502. The charge relationship is such that $Q_2=f(Q_1)$ with f a strictly monotonic function. Similarly, in the RCL mode, the stored charge $Q_2$ on capacitor 502 is sensed non-destructively and recalled as charge $Q_1$ on capacitor 501. Likewise, $Q_1=g(Q_2)$ with g strictly monotonic. No functional form is specified for the transfer functions f and g, except the requirement that the recall error, that is the change in charge $Q_1$ after successive STO and RCL operations, be zero: $Q_2=f(Q_1)$ has to imply $Q_1=g(Q_2)$ and vice versa. In practice, f and g do not need to be identity mappings, and decreasing functions or nonlinear mappings are allowed as well. For practical purposes, f and g may account for transfer offsets in an otherwise perfect replication process due to circuit non-idealities. Requiring a zero recall error is then equivalent to requiring the transfer offsets of the STO and RCL operations be identical but opposite.

d) An element, called a "comparator"; for comparing the amount of charge on a capacitor with a threshold, and assigning a value "1" to the output bit if the amount of charge is smaller than that threshold, and a value of "0" otherwise.

Figure 9A:
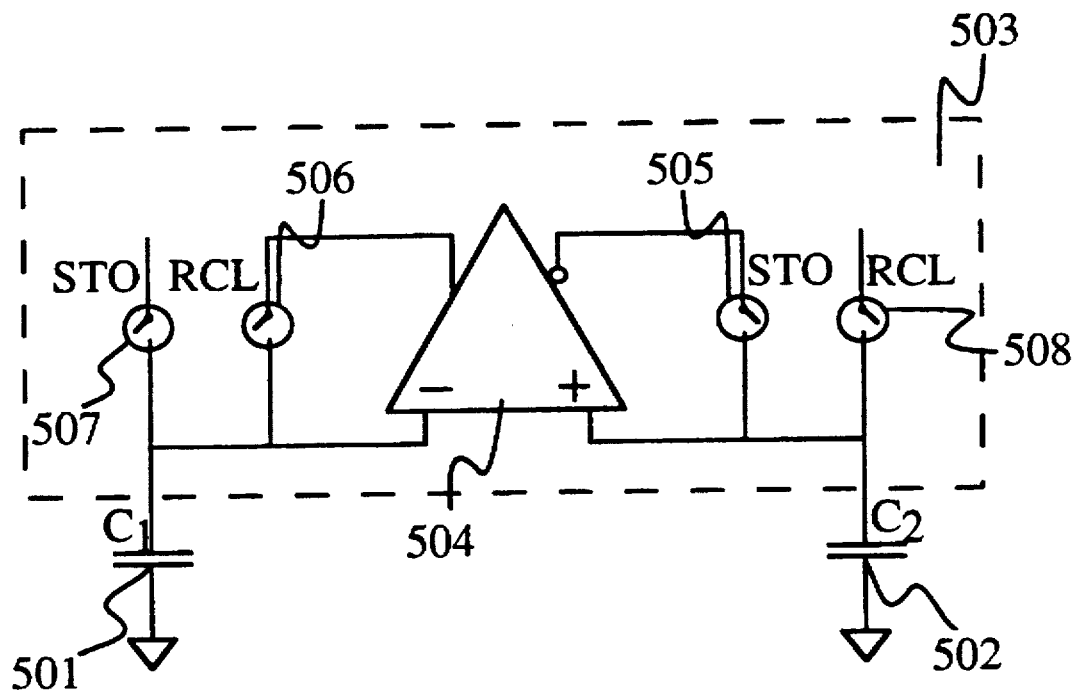
Figure 9:
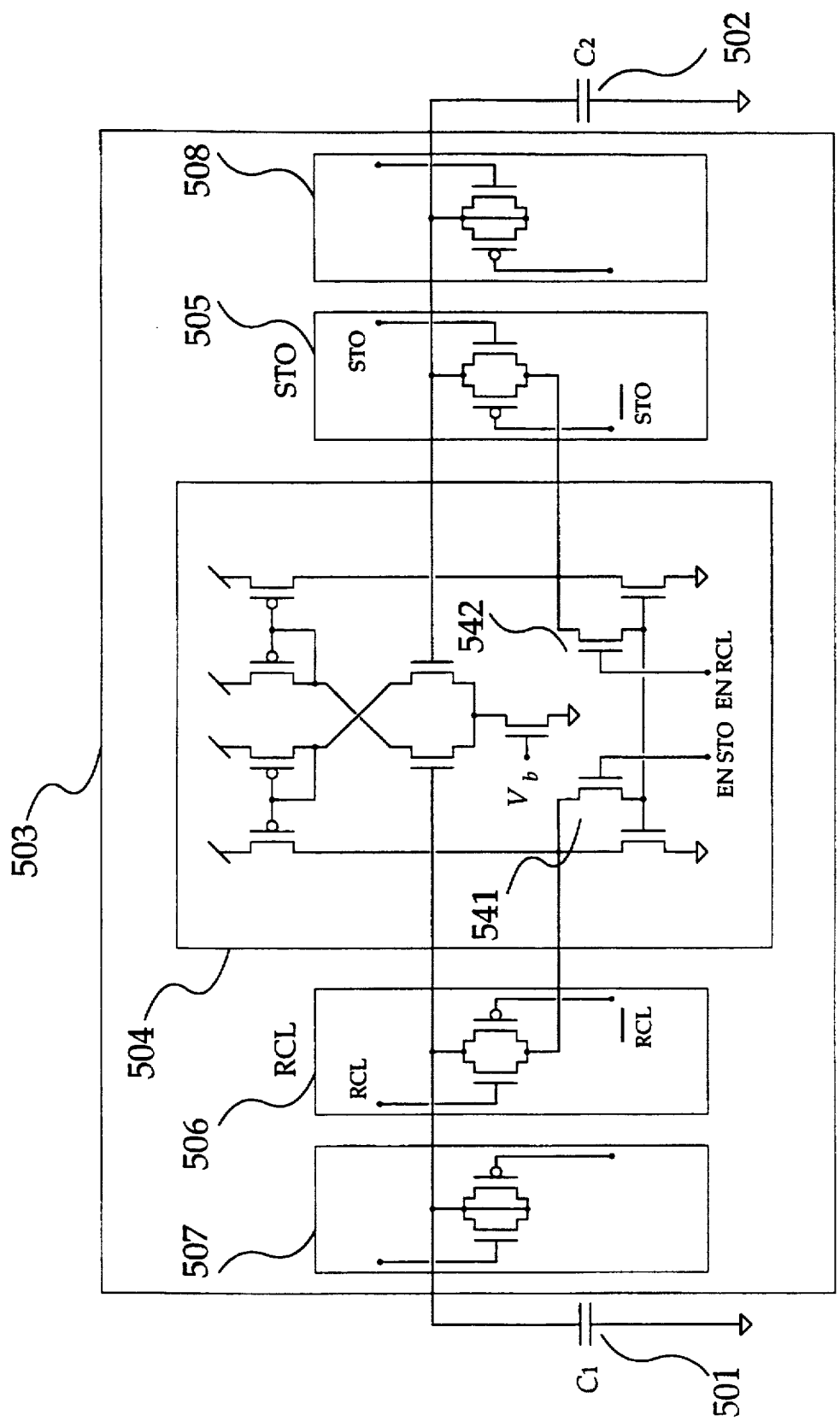

Specific circuit implementations of switching and comparing elements in various VLSI technologies are well-known in the art. One CMOS implementation of the BRE 503 of FIG. 8 that has a zero recall error, independent of process errors, is shown in FIG. 9a. The circuit consists of a differential operational transconductance amplifier (OTA) 504 with inverting and non-inverting high-impedance outputs. Coupled to OTA 504 are STO switch 505 and RCL switch 506. The circuit may optionally include dummy switches 507 and 508 for compensation of charge injection due to clock feed-through in switches 505 and 506. A possible transistor-level schematic of the BRE shown in FIG. 9a with a simple topology is illustrated in FIG. 9b. Of course, those of ordinary skill in the art may envision various alterations and additions to improve output impedance, gain, speed or other characteristics of the OTA, such as by using cascaded transistor pairs in the output stage. Only one of the two OTA outputs is enabled at one time; the other output is then disabled. The state of the enable switches ENSTO 541 and ENRCL 542 determine the selected output. In STO mode the STO switch 505 is activated while the inverting output is enabled (ENSTO 541 active); in RCL mode the RCL switch 506 is activated while the non-inverting output is enabled (ENRCL 542 active). The transistor mismatches in the OTA 504 induce a transfer offset for both the STO and RCL active operations. However, these offsets are nearly equal but opposite because the input-referred offset voltage of the OTA 504 is identical for the inverting and non-inverting outputs, provided the outputs are high-impedance, due to the topology of the transistors shown in FIG. 9b. Hence, the net loop offset for consecutive STO and RCL operations is about zero. Likewise, a replication circuit with zero or small recall error in other implementation technologies may be derived using similar principles.

Figure 10A:
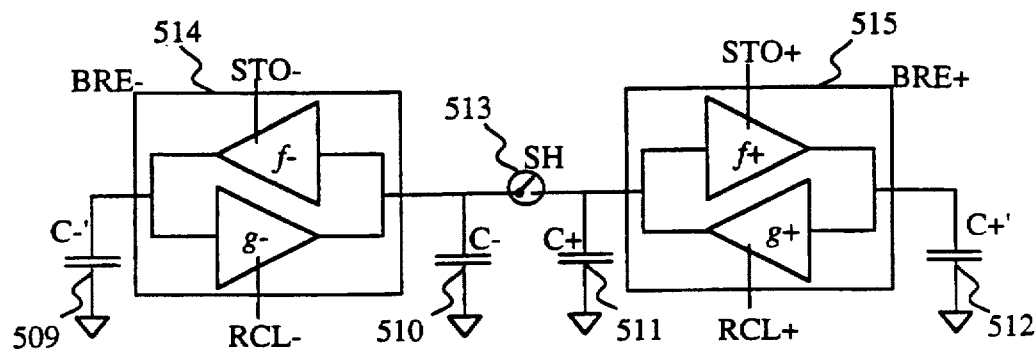

Referring now to FIG. 10a, a D/A converter appropriate for use as the D/A converter of FIG. 5 is illustrated. The circuit comprises four capacitors, $C^{-'}$ 509, $C^-$ 510, $C^+$ 511, and $C^{+'}$ 512, one switch SH 513, and two bi-directional replication elements, $BRE^-$ 514 and $BRE^+$ 515, in accordance with the above description. With respect to the above D/A conversion algorithm, the switch 513 and capacitors 510 and 511 serve the purpose of constructing a charge representing $U_i$ by averaging charges representing $U_i^+$ and $U_i^-$. Likewise, $BRE^-$ 514 with capacitor 509, as well as $BRE^+$ 515 with capacitor 512, function as analog charge storage registers for $U^{i+}$ and $U_i^-$ respectively, able to store present values of $U_i$ for later recall. The loop error of successive store and recall operations by the bi-directional replication elements, inducing an offset in the register values, is the main source of error which affects the conversion differential linearity, and hence should be minimized as specified above.

With the circuit configuration of FIG. 10a, the conversion algorithm translates in the following D/A conversion method, depicted symbolically below:

a) Initialization:

Precharge $C^-$ 510 to $Q_{ref}^-$, $C^{-'}$ 509 to $Q_{ref}^-$, $C^+$ 511 to $Q_{ref}^+$ and $C^{+'}$ 512 to $Q_{ref}^+$ such that:

$Q_{ref}^-=f^-(Q_{ref}^-)$ $(Q_{ref}^-=g^-(Q_{ref}^-))$; $Q_{ref}^+=f^+(Q_{ref}^+)$ $(Q_{ref}^+=g^+(Q_{ref}^+))$; and $Q_{ref}^-<Q_{ref}^+$ Then share $Q_{ref}^-$ and $Q_{ref}^+$ on $C^-$ 510 and $C^+$ 511 by activating switch 513.

b) Algorithm Iteration:

From the first (MSB) to the last (LSB) bit, iterate:

If the bit is

---

"1": Activate $BRE^-$ 514 in STO mode (activate $STO^-$), activate $BRE^+$ 515 in RCL mode (activate $RCL^+$);

"0": Activate $BRE^-$ 514 in RCL mode (activate $RCL^-$), activate $BRE^+$ 515 in STO mode (activate $STO^+$);

---

Then share $Q^-$ and $Q_+$ on $C^-$ 510 and $C^+$ 511 by activating switch 513.

c) Termination:

The converted charge is represented by either of $Q^-$ on $C^-$ 510 or $Q^+$ on $C^+$ 511.

The precharging procedure of the initialization step can be performed in a number of ways, e.g., by charging capacitor 510 to $Q_{ref}^+$, capacitor 511 to $Q_{ref}^-$, with $Q_{ref}^-$ being less than $Q_{ref}^+$, and then activating both BRE$^-$ 514 and BRE$^-$ 515 in STO mode. Likewise, capacitor 509 can be charged to $Q_{ref}^-$ and BRE$^-$ 514 activated in RCL mode instead, or capacitor 512 can be charged to $Q_{ref}^+$ and BRE$^+$ 515 activated in RCL mode. In addition to aforementioned precharging methods and combinations of these methods, different methods exist as well, and the choice of the precharging method does not affect the performance of the converter. A possible transistor-level CMOS implementation of the D/A converter of the invention, based on the BRE embodiment of FIG. 9b, is given in FIG. 10b, which also includes switches 551–554 assisting in the precharging procedure.

Figure 11A:
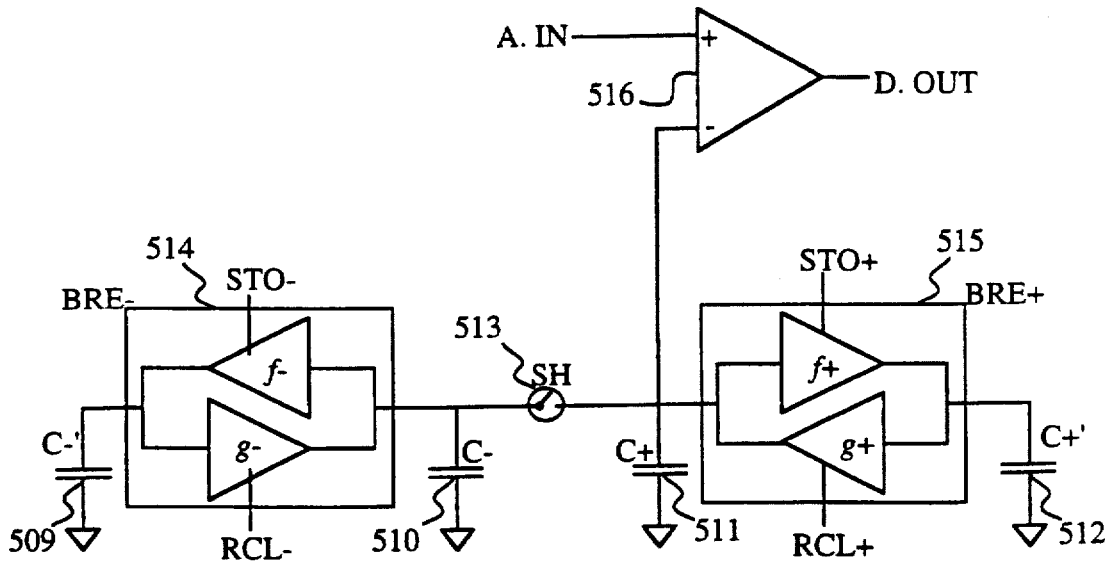
Figure 10:
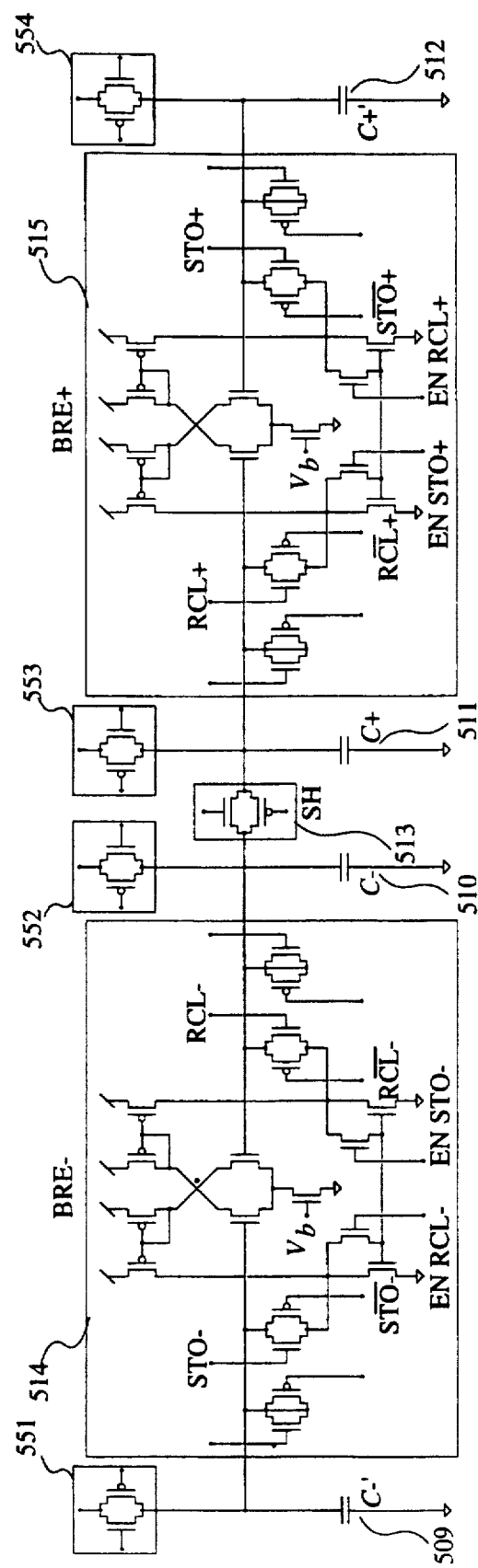
Figure 11:
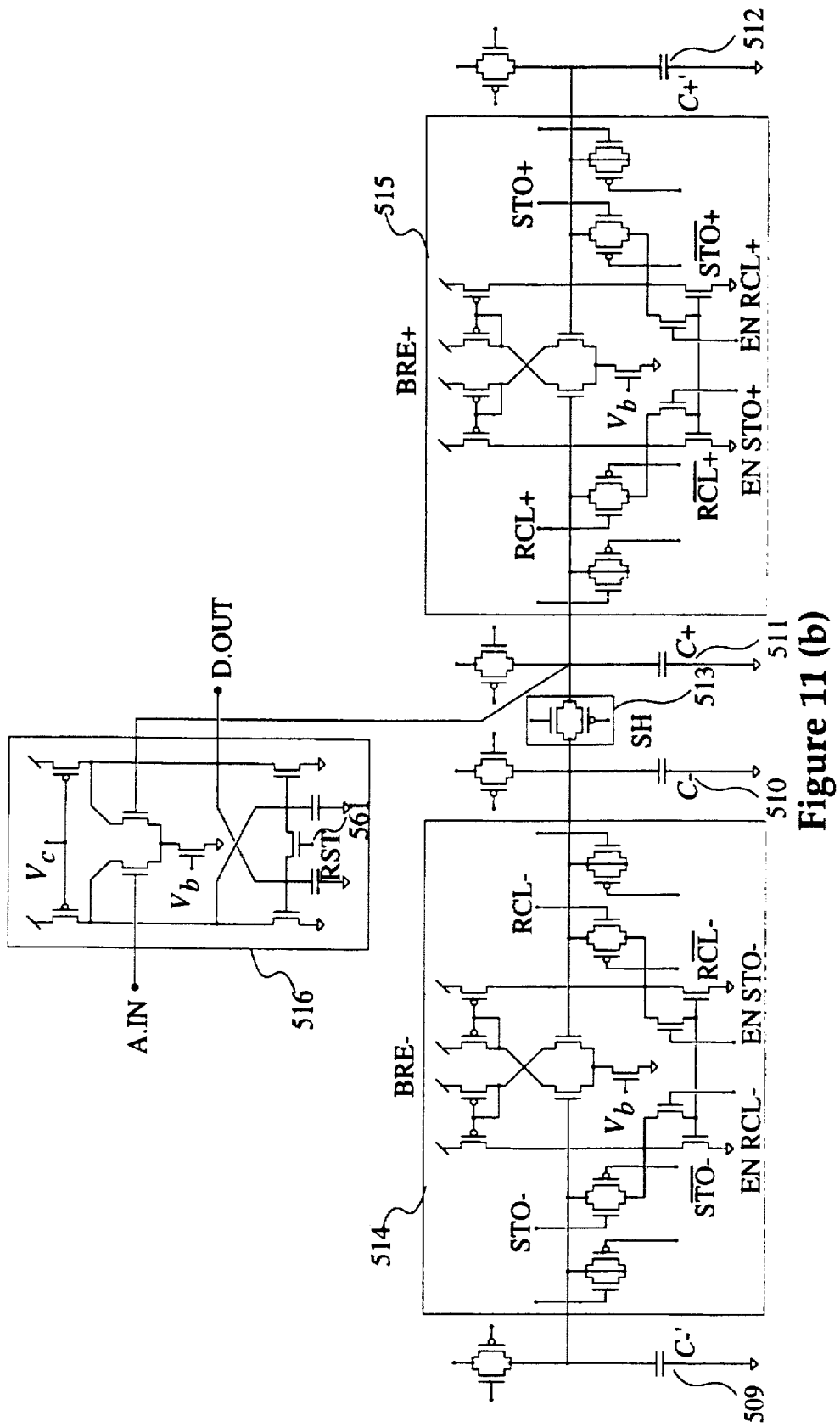

Referring next to FIG. 11(a), an A/D converter in accordance with the present invention is shown. The A/D converter comprises the D/A converter shown in FIG. 10(a) being further coupled to a comparator 516 which receives the analog input for conversion to a digital word. Coupled to either of the capacitors 510 and 511, the comparator senses the intermediate D/A conversion results which serve as the successive approximation values for comparison with the analog input. The results of comparison determine the digital output word in a sequence from MSB to LSB. In turn, the output bits synchronously feed into the D/A converter so as to provide the successive approximations. More specifically, the method of A/D conversion with the circuit of FIG. 11(a) consists of the following sequence of instructions:

a) Initialization:
   Same initialization procedure as for D/A conversion described above.
b) Successive approximation:
   For n successive steps, determine a new bit as follows:
   Compare A.IN with $Q^+$ on $C^+$ 511 (or $Q^-$ on $C^-$ 510)
   (Evaluate the output D.OUT from the comparator, which is "1" if A.IN is the greater, and which is "0" otherwise);
   Set the bit to D.OUT;
   If the bit is "1": Activate BRE$^-$ 514 in STO mode (activate STO$^-$)
        activate BRE$^+$ 515 in RCL mode (activate RCL$^+$);
   "0": Activate BRE$^-$ 514 in RCL mode (activate RCL$^-$)
        activate BRE$^+$ 515 in STO mode (activate STO$^+$);

Then share $Q^-$ and $Q^+$ by activating switch SH 513;
c) Termination:
   The digital word is given by the sequence of the bits from b) in the order processed, the MSB first and the LSB last.

In principle, for the last iteration the replication and charge sharing instructions can be omitted, as by then the final bit has been determined. However, the instructions following the assignment of the LSB value should be completed in case the final approximation analog value, corresponding to the converted digital word, is required.

FIG. 11b shows a possible transistor-level CMOS implementation of the A/D converter of the invention, based on the D/A converter embodiment of FIG. 10b. The comparator circuit 516 contains a cross-coupled transistor output stage for latched operation; a high pulse on the RST gate 561 triggers the comparison and fixes the output D.OUT at the falling pulse edge.

Figure 12A:
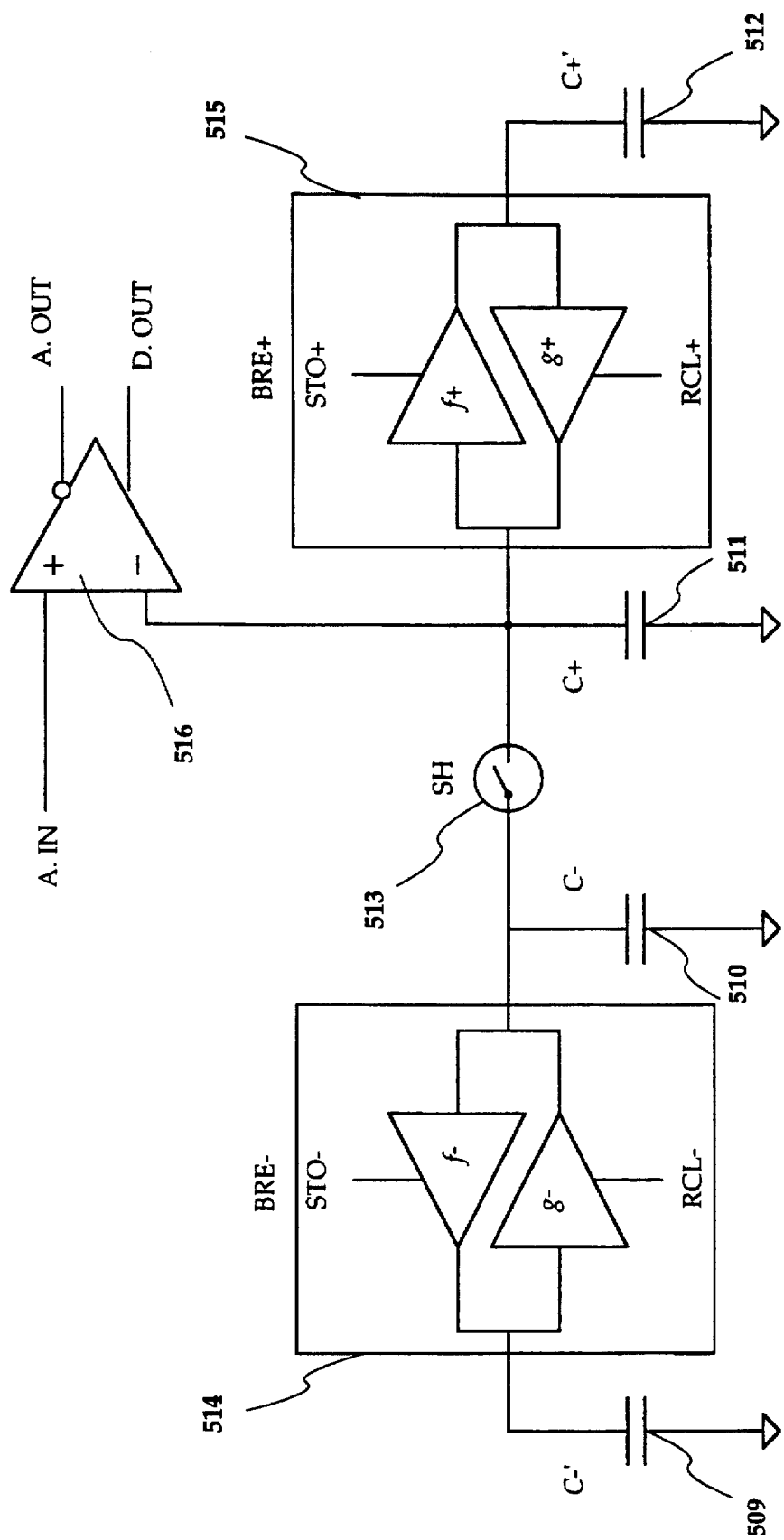
Figure 12:
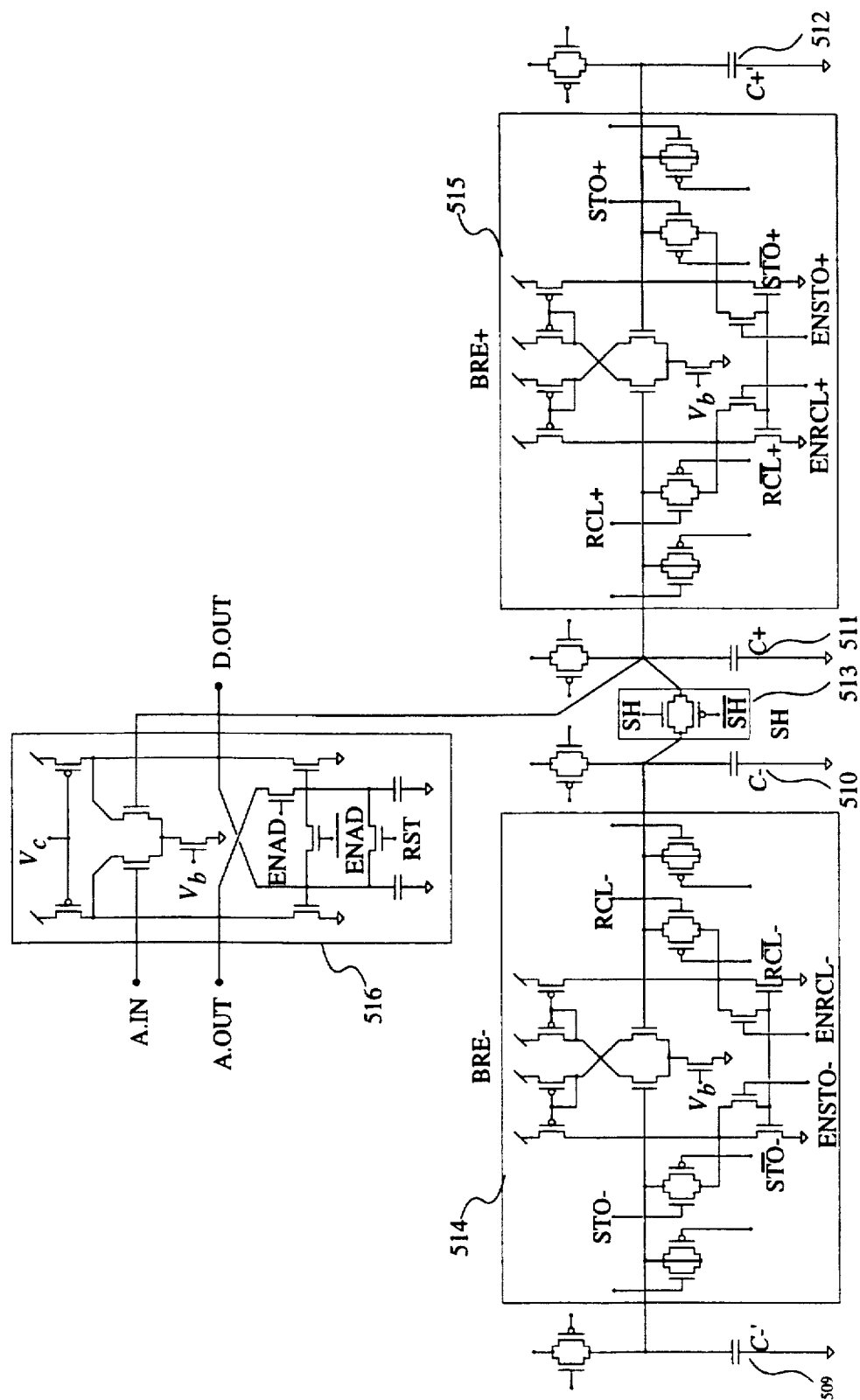

A particularly useful feature of the described converter apparatus, with reference to the invention presented here, concerns its versatility, capable of performing both A/D and D/A conversions within a single structure. The A/D converter internal to the D/A converter of FIG. 11a can in principle be addressed individually. To support random-access data transfer between analog and digital formats, the D/A converter and comparator internal to the A/D converter in FIG. 11a can be configured alternatively, according to the A/D/A structure shown in FIG. 5. The combined A/D and D/A converter is especially attractive as it provides almost perfectly matched transfer characteristics for conversion between both formats, in analog and digital directions. To ensure perfect matching between both directions of conversion, the comparator output is complemented with an extra inverting high-impedance transconductance output, conform to the general architecture of FIG. 5 and shown in one embodiment in FIG. 12a. Such output allows a negative feedback connection to the analog input node A.IN of comparator 516 providing an analog output which matches the input offset of the comparator when the connection is established. A possible detailed structure for the resulting combined A/D and D/A converter in CMOS technology, based on the structures of FIG. 10b and 11b, is shown in FIG. 12b. The ENAD logic signal and its complement control the operation mode of the converter A/D conversion mode (D.OUT active; latched comparator enabled) is achieved when ENAD is high; D/A conversion mode (A.OUT active; negative feedback enable) is obtained with ENAD low. Optionally, a switch between the nodes A.IN and A.OUT may be provided to establish the feedback path for the digital write operations, as shown in the A/D/A quantizer of FIG. 5.

As described above, the A/D/A converter used in one embodiment of the invention may be implemented in various technologies and with different component structures. In technology environments where a direct relationship exists between charge and voltage with respect to the charge holding devices, the references to charge in the above description apply equally to voltage. In such a case the charge holding devices can be characterized as "capacitors" in the true sense of the term. Examples of embodiments of the invention implemented in CMOS technology with analogs for the charge holding devices were given in FIGS. 10b–11b. The detailed component structure of these circuits allows for countless variations that each may address different performance requirements, such as speed, compactness, power, accuracy, etc.

Thus, FIGS. 8–12b illustrate configurations of an analog-to-digital-to-analog converter which may be used as the quantizer of the analog value refresh apparatus described with reference to FIGS. 1–5

Experimental Results

Figure 13A:
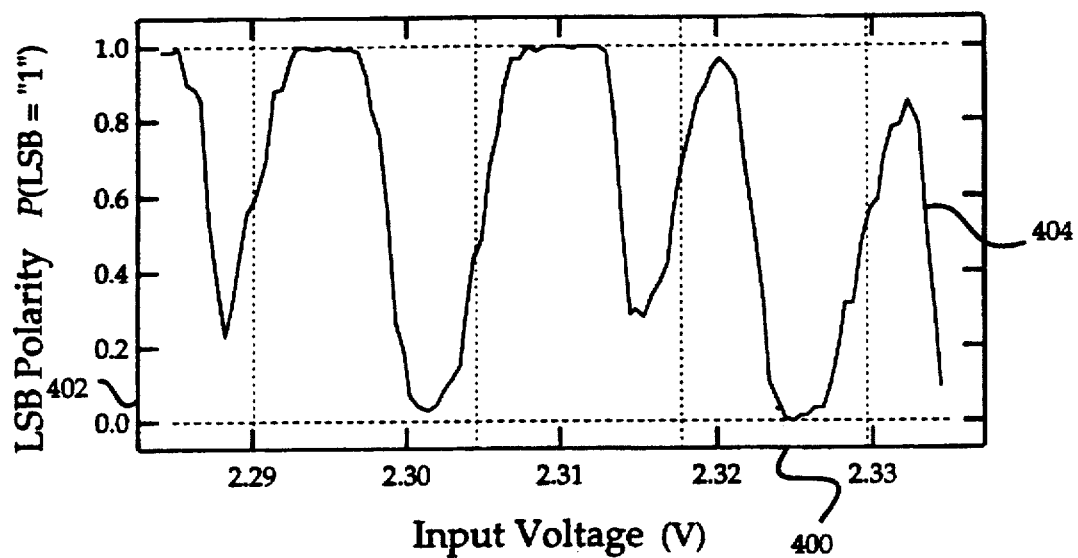
FIG. 13a is a graph illustrating the measured probability of a least significant bit polarity as a function of input voltage for an exemplary embodiment of the binary quantizer of FIG. 5b.
Figure 13B:
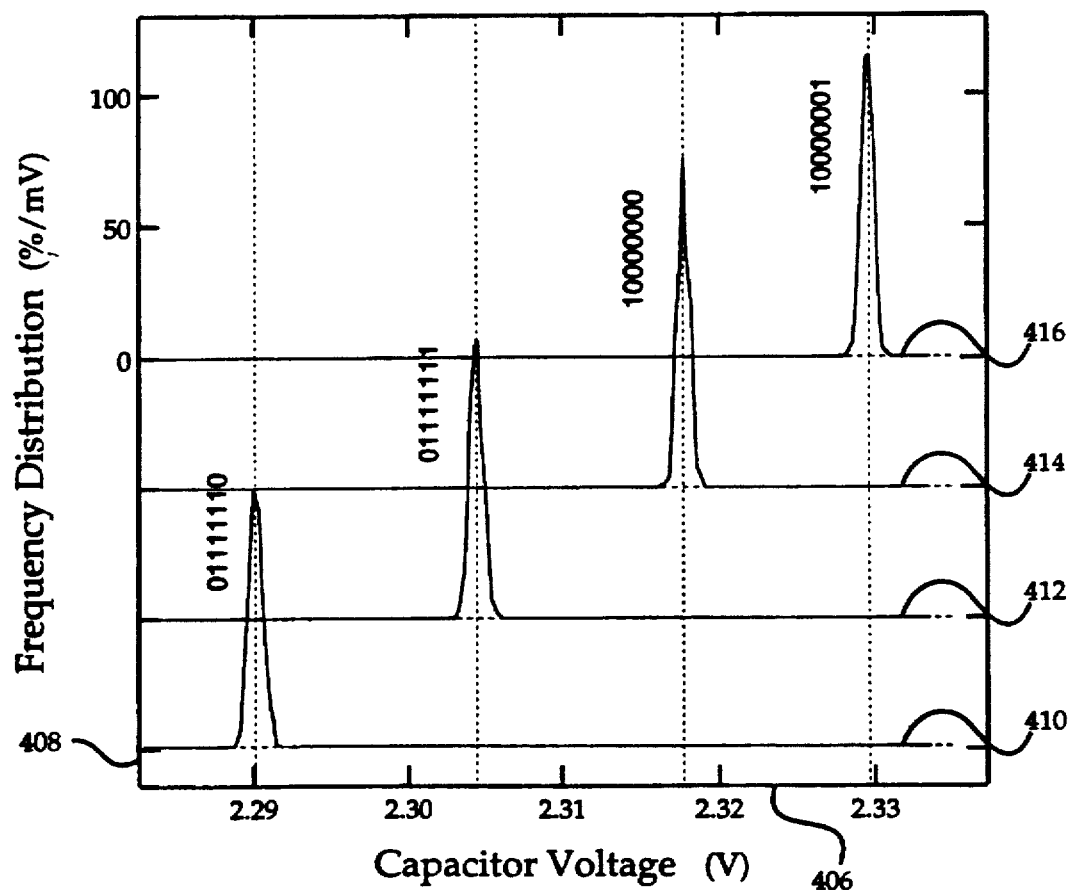
FIG. 13b is a graph illustrating voltage distribution of quantized states illustrating a frequency distribution as a function of capacitor voltage for an exemplary embodiment of the analog storage memory of FIG. 3b.

FIGS. 13a and 13b graphically illustrate results of an experiment conducted to verify the operation of an analog memory constructed in accordance with the embodiment shown in FIG. 3b which employs an A/D/A converter as schematically represented in FIG. 5. More specifically, the experimental results were obtained from a VLSI chip implementing a particular embodiment of the invention. A 4 mm$^2$ chip was fabricated in a MOSIS2 μm—CMOS double-poly Orbit process, to contain 4 rows of 32 capacitive memory cells each, with every row driven by a single binary quantizer in a time-multiplexed configuration conforming to that of FIG. 3b. The bipolar incremental refresh device was implemented with the I/D circuit embodiment of FIG. 4. For the binary quantizer, an A/D/A bi-directional conversion device with the architecture of FIG. 5 and functional elements similar to FIG. 12b was employed for providing digital access to the memory. The size of the capacitive storage elements was 1 pF. With special care to minimize parasitic junction leakage current induced by the MOS transistors coupled to the storage capacitors, the drift rate of the stored voltages was reduced to about 0.2 mV/sec at room temperature.

FIGS. 13a and 13b demonstrate the robustness of analog memory operation in noisy and imprecise environments. Although the embodiment of the A/D/A converter used for the quantization was specifically designed and rated for a resolution of eight bits, the device was required to operate at 9-bit resolution in A/D conversion mode to support an 8-bit effective quantization (256 discrete levels) of the analog memory. No precaution was taken to shield the circuitry from noise originating in the power supply and from various other external noise sources. All this caused relatively poor accuracy and noise performance of the binary quantization obtained form the LSB of the conversion. FIG. 13a shows the measured probability distribution of the quantization bit as a function of input voltage, in the neighborhood of the most critical bit-transition of the converter.

In FIG. 13a, input voltages are represented along axis 400 whereas LSV polarity is represented along axis 402. The measured probability and distribution curve is identified by reference numeral 404. The distribution, which ideally follows sharp and regularly spaced transitions, shows signs of distortion caused by noise and conversion non-linearities, giving rise to frequent errors in the individual updates under refresh. Nevertheless, for a very small amplitudes of the refresh updates (20 μV) relative to the separation Δ between the discrete levels (13 mV), the memory experimentally demonstrated long-term storage with perfect data retention over time spans exceeding $10^9$ refresh cycles. This robustness was observed even for relatively "weak" memory states such as the one corresponding to "10000000", for which FIG. 13a predicts an individual error rate higher than 30% at its boundary toward the state "01111111" Even at an elevated 30% error rate, it is quite unlikely that an ensemble of consecutive quantization bits will produce a consistent drift away from the correct memory level. Hence, long-term stability of the memory is achieved despite a high quantization error rate.

FIG. 13b shows a measured histogram distribution for the voltage level stored on an analog memory cell, preset initially to either of four adjacent memory states, under periodic refresh at 5 msec intervals and with 20 μV update steps. In FIG. 13b capacitive voltage is represented along axis 406, whereas a frequency of distribution is represented along axis 408. Curves 410, 412, 414 and 416 provide histograms for individual memory states. In FIG. 13b the bit sequences corresponding to the individual memory states are illustrated adjacent to respective histogram curves. By virtue of the iterative refresh method of the invention, the excursion of the memory value is confined to a narrow band with observed width less than 2 mV (limited by the resolution of a voltmeter used to measure the voltage), a width significantly better than the intrinsic voltage discrimination capability supported by the quantizer due to the noise and the conversion non-linearity.

Thus, FIGS. 13a–13b illustrate the results of experiments which verify the high accuracy and robustness of an analog memory constructed in accordance with the principles of the invention. Even under noisy and imprecise conditions, the analog memory retained the states in which it was programmed, with limited excursion of the analog values away from the ideal memory levels over extended periods of time, significantly exceeding the intrinsic retention of time of the volatile analog storage medium.

What has been described is a method and apparatus for performing analog storage. Principles of the invention have been described with reference to various particular exemplary embodiments, and certain alternative embodiments have been also set forth. In one such embodiment, an A/D/A converter is employed, the details of which have also been set forth herein.

In addition to the above embodiments of the present invention, various alterations may be made by those skilled in the art without departing from the spirit and scope of the invention. The invention should therefore be measured in terms of the claims which follow.

What is claimed is:

1. An apparatus comprising:

storage means for storing an analog value; and refresh means for repeatedly either increasing or decreasing said analog value of said storage means by pre-selected incremental amounts to maintain said analog value near one of a plurality of discrete levels, with said analog value being increased or decreased depending on a determination of the analog value.

2. The apparatus of claim 1, wherein said refresh means comprises means for generating a binary value assigned to a first state if said analog value is greater than a nearest adjacent discrete level and assigned to a second state, if said analog value is less than said nearest adjacent level; and increment/decrement means for increasing said analog value by a first pre-selected amount, if said binary value is in said first state, and for decreasing said analog value by a second pre-selected amount, if said binary value is in said second state.

3. The apparatus of claim 1, wherein said refresh means comprises binary quantization means for generating a binary value in response to said analog value of said storage means, said binary value being in either a first state or a second state, with the state of said binary value being determined from said analog value in a consistent and substantially repeatable manner;

increment/decrement means for increasing said analog value by a first pre-selected amount, if said binary value is in said first state, and for decreasing said analog value by a second pre-selected amount, if said binary value is in said second state.

4. The apparatus of claim 3, wherein said first and second pre-selected amounts are substantially equal.

5. The apparatus of claim 3, wherein said first and second pre-selected amounts are substantially less than a minimum separation between adjacent predetermined analog levels.

6. The apparatus of claim 3, wherein said first and second pre-selected amounts are greater than $r_1 T$, wherein $r_1$ is a leakage drift rate for said storage means and T is a refresh time interval.

7. The apparatus of claim 3, wherein a plurality of said storage means and a plurality of said increment/decrement means are provided, with said quantization means sequentially generating a binary value in response to the analog value of one particular one of said plurality of storage means at a time, and with one of said plurality of increment/decrement means subsequently increasing or decreasing said analog value of said one particular storage means using said binary value from said quantization means.

8. The apparatus of claim 3 or claim 7, wherein said binary quantization means comprises:
- a comparator with non-inverting and inverting inputs and non-inverted output, said comparator being operated in a latched comparison mode;
- a digital-to-analog converter having a bit-serial digital input connected to said non-inverted output of said comparator and having an analog output connected to said inverting input of said comparator;
- with said analog value being supplied to said non-inverting input of said comparator, and with said binary value being obtained from said non-inverted output of said comparator.

9. The apparatus of claim 8, further providing write access to said analog value, said comparator including an inverted output, with said inverted output being active and said comparator being operated in differential amplification mode during a write phase, and with said non-inverted output of said comparator being active and said comparator being operated in latched comparison mode otherwise.

10. The apparatus of claim 9, further including a write switch connected between said inverted output and said non-inverting input of said comparator, said write switch being activated only during said write phase.

11. The apparatus of claim 8, wherein said digital-to-analog converter comprises:
- first and second charge holding means each capable of holding an electric charge;
- switching means coupled to said first and second charge holding means, said switching means when activated electrically coupling said first and second charge holding means for sharing and redistributing the charge contained by said first and second charge holding means with approximately equal charge density;
- third and fourth charge holding means each capable of holding an electric charge;
- a first bi-directional replication element coupled between said first charge holding means and said third charge holding means, said first bi-directional replication element having a store mode and a recall mode of operation, said first bi-directional replication element establishing a charge on said third charge holding means corresponding to the charge stored on said first charge holding means determined by a first transfer function when said first bi-directional replication element is operated in store mode, said first bi-directional replication element establishing a charge on said first charge holding means corresponding to the charge stored on said third charge holding means determined by a second transfer function when said first bi-directional replication element is operated in recall mode; and
- a second bi-directional replication element coupled between said second charge holding means and said fourth charge holding means, said second bi-directional replication element having a store mode and a recall mode of operation, said second bi-directional replication element establishing a charge on said fourth charge holding means corresponding to the charge stored on said second charge holding means determined by a third transfer function when said second bi-directional replication element is operated in store mode, said second bi-directional replication element establishing a charge on said second charge holding means corresponding to the charge stored on said fourth charge holding means determined by a fourth transfer function when said second bi-directional replication element is operated in recall mode,
- with said analog output of said digital-to-analog converter being obtained from the charge contained by either said first or second charge holding means, and with said bit-serial digital input of said digital-to-analog converter determining said store and recall operations of said first and second bi-directional replication elements sequentially.

12. The apparatus of claim 3 or claim 7, wherein said means for storing an analog value is a capacitor and wherein said increment/decrement means comprises:
- a NOR-gate having a first input receiving a first control signal and a second input receiving a second control signal;
- a NAND-gate having a first input receiving a complement for said first control signal and a second input receiving said second control signal;
- a pMOS transistor having a source connected to an output of said NOR-gate, a gate connected to a first constant bias voltage, and a drain connected to an output node; and
- an nMOS transistor having a source connected to an output of said NAND-gate, a gate connected to a second constant bias voltage and a drain connected to said output node.

13. The apparatus of claim 1, further including means for externally accessing and altering said analog value on said storage means.

14. The apparatus of claim 1, wherein a plurality of said storage means are provided with said refresh means sequentially refreshing one of said plurality of storage means at a time.

15. An apparatus for repeatedly refreshing an analog value stored in a storage means, said apparatus comprising:
- binary quantization means for repeatedly generating a binary value in response to said analog value stored in said storage means, said binary value being either a first or a second state; and
- increment/decrement means, responsive to each binary value, for increasing said analog value by a first pre-select amount, if said binary value is in said first state, and for decreasing said analog value by a second pre-selected amount, if said binary value is in said second state; with
- the state of said binary value generated by said quantization means being determined from said analog value in a consistent and substantially repeatable manner.

16. The apparatus of claim 15, wherein said first and second pre-selected amounts are substantially equal.

17. The apparatus of claim 15, wherein a plurality of said storage means and a plurality of said increment/decrement means are provided, with said quantization means sequentially generating a binary value in response to the analog value of one particular one of said plurality of storage means at a time, and with one of said plurality of increment/decrement means subsequently increasing or decreasing said analog value of said one particular storage means using said binary value from said quantization means.

18. The apparatus of claim 15 or claim 17, wherein said binary quantization means comprises:
- a comparator with non-inverting and inverting inputs and non-inverted output, said comparator being operated in a latch comparison mode;
- a digital-to-analog converter having a bit-serial digital input connected to said non-inverted output of said comparator and having an analog output connected to said inverting input of said comparator;

with said analog value being supplied to said non-inverting input of said comparator, and with said binary value being obtained from said non-inverted output of said comparator.

19. The apparatus of claim 18, further providing write access to said analog value, said comparator including an inverted output, with said inverted output being active and said comparator being operated in differential amplification mode during a write phase, and with said non-inverted output of said comparator being active and said comparator being operated in latched comparison mode otherwise.

20. The apparatus of claim 19, further including a write switch connected between said inverted output and said non-inverting input of said comparator, said write switch being activated only during said write phase.

21. The apparatus of claim 18, wherein said digital-to-analog converter comprises:

first and second charge holding means each capable of holding an electric charge;

switching means coupled to said first and second charge holding means, said switching means when activated electrically coupling said first and second charge holding means for sharing and redistributing the charge contained by said first and second charge holding means with approximately equal charge density;

third and fourth charge holding means each capable of holding an electric charge;

a first bi-directional replication element coupled between said first charge holding means and said third charge holding means, said first bi-directional replication element having a store mode and a recall mode of operation, said first bi-directional replication element establishing a charge on said third charge holding means corresponding to the charge stored on said first charge holding means determined by a first transfer function when said first bi-directional replication element is operated in store mode, said first bi-directional replication element establishing a charge on said first charge holding means corresponding to the charge stored on said third charge holding means determined by a second transfer function when said first bi-directional replication element is operated in recall mode; and a second bi-directional replication element coupled between said second charge holding means and said fourth charge holding means, said second bi-directional replication element having a store mode and a recall mode of operation, said second bi-directional replication element establishing a charge on said fourth charge holding means corresponding to the charge stored on said second charge holding means determined by a third transfer function when said second bi-directional replication element is operated in store mode, said second bi-directional replication element establishing a charge on said second charge holding means corresponding to the charge stored on said fourth charge holding means determined by a fourth transfer function when said second hi-directional replication element is operated in recall mode, with said analog output of said digital-to-analog converter being obtained from the charge contained by either said first or second charge holding means, and with said bit-serial digital input of said digital-to-analog converter determining said store and recall operations of said first and second bi-directional replication elements sequentially.

22. The apparatus of claim 15 or claim 17, wherein the analog storage means is a capacitor and wherein said increment/decrement means comprises:

a NOR-gate having a first input receiving a first control signal and a second input receiving a second control signal;

a NAND-gate having a first input receiving said first control signal inverted and a second input receiving said second control signal;

a pMOS transistor having a source connected to an output of said NOR-gate, a gate connected to a first constant bias voltage, and a drain connected to an output node; and an nMOS transistor having a source connected to an output of said NAND-gate, a gate connected to a second constant bias voltage and a drain connected to said output node.

23. In an analog multi-valued memory comprising analog storage means, an apparatus for refreshing the analog value on said analog storage means defining the state of said analog multi-valued memory comprising:

means for obtaining a binary quantization value corresponding to said analog value, said binary quantization value being in either a first or a second state; and means for increasing said analog value by a first fixed amount, if said binary quantization value is in said first state, and for decreasing said analog value by a second fixed amount, if said binary quantization value is in said second state.

24. The apparatus of claim 23, wherein said means for generating a binary quantization value and the means for increasing or decreasing the analog value are operated repeatedly to maintain said analog value near a predetermined analog level.

25. The apparatus of claim 23, wherein said binary value is assigned to said first state if said analog value is below a nearest predetermined analog level and wherein said binary value is assigned to said second state if said analog value is greater than said nearest predetermined analog level.

26. A method for maintaining an analog value near one of a plurality of discrete levels, said method comprising repeating the step of:

either increasing or decreasing said analog value by pre-selected amounts, with said analog value being increased or decreased depending on said analog value.

27. The method of claim 26, wherein said step further comprises the steps of:

generating a binary value assigned to a first state if said analog value is greater than a nearest adjacent discrete level and assigned to a second state, if said analog value is less than said nearest adjacent level; and increasing said analog value by a first pre-selected amount, if said binary value is in said first state, and decreasing said analog value by a second pre-selected amount, if said binary value is in said second state.

28. The method of claim 26, wherein said step further comprises the steps of:

generating a binary value in response to said analog value, said binary value being in either a first state or a second state, with the state of said binary value being determined from said analog value in a consistent and substantially repeatable manner; and increasing said analog value by a first pre-selected amount, if said binary value is in said first state, and decreasing said analog value by a second pre-selected amount, if said binary value is in said second state.

29. The method of claim 28, wherein said first and second pre-selected amounts are substantially equal.

30. The method of claim 28, wherein said first and second pre-selected amounts are substantially less than a minimum separation between adjacent said predetermined analog levels.

31. The method of claim 28, wherein said first and second pre-selected amounts are greater than $r_1 T$, wherein $r_1$ is a leakage drift rate for said storage means and T is a refresh time interval.

32. A method for refreshing an analog value stored in an analog value storage means, said method comprising the steps of:
generating a binary value in response to an analog value stored in the analog storage means, said binary value being in either a first state or a second state, with the state of said binary value being determined from said analog value in a consistent and substantially repeatable manner; and
increasing said analog value by a first pre-selected amount, if said binary value is in said first state, and decreasing said analog value by a second pre-selected amount, if said binary value is in said second state.

33. The method of claim 32, wherein said first and second pre-selected amounts are substantially equal.

34. In an analog multi-valued memory comprising analog storage means, the method of refreshing the analog value on said analog storage means defining the state of said analog multi-valued memory comprising the steps of:
obtaining a binary quantization value corresponding to said analog value, said binary quantization value being in either a first or a second state;
increasing said analog value by a first fixed amount, if said binary value is in said first state; and
decreasing said analog value by a second fixed amount, if said binary quantization value is in said second state.

35. The apparatus of claim 34, wherein said steps of generating a binary quantization value and increasing or decreasing the analog value are performed repeatedly to maintain said analog value near a predetermined analog level.

36. The method of claim 34, wherein said binary value is assigned to said first state if said analog value is below a nearest predetermined analog level and wherein said binary value is assigned to said second state if said analog value is greater than said nearest predetermined analog level.

* * * * *